(12) United States Patent
Moschiano et al.

(10) Patent No.: US 8,917,553 B2
(45) Date of Patent: Dec. 23, 2014

(54) NON-VOLATILE MEMORY PROGRAMMING

(75) Inventors: Violante Moschiano, Bacoli (IT); Giovanni Santin, Rieti (IT); Michele Incarnati, Gioia dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 565 days.

(21) Appl. No.: 13/072,478

(22) Filed: Mar. 25, 2011

(65) Prior Publication Data
US 2012/0243318 A1   Sep. 27, 2012

(51) Int. Cl.
G11C 16/10 (2006.01)
G11C 16/34 (2006.01)
G11C 11/56 (2006.01)
G11C 16/04 (2006.01)

(52) U.S. Cl.
CPC ............ *G11C 16/10* (2013.01); *G11C 16/3459* (2013.01); *G11C 11/5628* (2013.01); *G11C 16/0483* (2013.01)
USPC .................................................... 365/185.18

(58) Field of Classification Search
CPC ............... G11C 16/10; G11C 16/0483; G11C 16/3459; G11C 11/5628
USPC .................................................... 365/185.18
See application file for complete search history.

(56) References Cited

U.S. PATENT DOCUMENTS

| 6,392,931 | B1 | 5/2002 | Pasotti et al. |
| 7,072,221 | B2 | 7/2006 | Wang |
| 7,221,598 | B2 | 5/2007 | Jeong |
| 7,324,383 | B2 | 1/2008 | Incarnati et al. |
| 7,692,971 | B2 | 4/2010 | Moschiano et al. |
| 2007/0183215 | A1 | 8/2007 | Sugawara |
| 2008/0298124 | A1 | 12/2008 | Wong |
| 2009/0010068 | A1 | 1/2009 | Lee |
| 2009/0052256 | A1* | 2/2009 | Sutardja ................... 365/185.19 |
| 2009/0129157 | A1* | 5/2009 | Honda et al. ............. 365/185.03 |
| 2009/0207657 | A1* | 8/2009 | Tamada ................... 365/185.03 |
| 2010/0039863 | A1* | 2/2010 | Sarin et al. ............... 365/185.19 |

(Continued)

FOREIGN PATENT DOCUMENTS

CN   103460297 A   12/2013
KR   1020120005828 A   1/2012

(Continued)

OTHER PUBLICATIONS

"International Application Serial No. PCT/US2012/030430, Search Report mailed Oct. 18, 2012", 3 pgs.

(Continued)

*Primary Examiner* — Hoai V Ho
*Assistant Examiner* — Tri Hoang
(74) *Attorney, Agent, or Firm* — Schwegman Lundberg & Woessner, P.A.

(57) ABSTRACT

Some embodiments include a memory device and a method of programming memory cells of the memory device. One such method can include applying a signal to a line associated with a memory cell, the signal being generated based on digital information. The method can also include, while the signal is applied to the line, determining whether a state of the memory cell is near a target state when the digital information has a first value, and determining whether the state of the memory cell has reached the target state when the digital information has a second value. Other embodiments including additional memory devices and methods are described.

21 Claims, 16 Drawing Sheets

(56) References Cited

U.S. PATENT DOCUMENTS

| | | | |
|---|---|---|---|
| 2010/0115176 A1* | 5/2010 | Sarin et al. | 711/103 |
| 2010/0128523 A1 | 5/2010 | Yip | |
| 2011/0007571 A1 | 1/2011 | Park et al. | |

FOREIGN PATENT DOCUMENTS

| | | |
|---|---|---|
| TW | 201303875 A | 1/2003 |
| WO | WO-2012135060 A2 | 10/2012 |
| WO | WO-2012135060 A3 | 10/2012 |

OTHER PUBLICATIONS

"International Application Serial No. PCT/US2012/030430, Written Opinion mailed Oct. 18, 2012", 6 pgs.

"International Application Serial No. PCT/US2012/030430, International Preliminary Report on Patentability mailed Oct. 10, 2013", 8 pgs.

* cited by examiner

| INFORMATION IN (DECIMAL FORM) | INFORMATION IN (BINARY FORM) | $V_{RAMP}$ | $PV_i$ | $VT_i$ | $V_{RAMP}$ EXAMPLE VOLTAGE VALUE (Volt) |
|---|---|---|---|---|---|
| 0 | 00000000 | +Va | | | 0 |
| 1 | 00000001 | +Vb | | | 0.1 |
| 2 | 00000010 | +Vc | | | 0.2 |
| 3 | 00000011 | +Vd | | | 0.3 |
| 4 | 00000100 | +Ve | | | 0.4 |
| 5 | 00000101 | +Vf | | | 0.4 0.48($PPV_1$) |
| 6 | 00000110 | V1 | $PV_1$ | $VT_1$ | 0.5 |
| 7 | 00000111 | +Vg | | | 0.6 |
| ... | ... | ... | | | 0.7 |
| X-2 | 00001101 | +Vh | | | ... |
| X-1 | 00001110 | +Vi | | | 1.4 1.48($PPV_2$) |
| X (e.g., 16) | 00010000 | V2 | $PV_2$ | $VT_2$ | 1.5 |
| X+1 | 00010001 | +Vj | | | 1.6 |
| ... | ... | ... | | | 1.7 |
| Y-2 | 00101100 | +Vk | | | ... |
| Y-1 | 00101101 | +Vl | | | 4.4 4.48($PPV_5$) |
| Y (e.g., 46) | 00101110 | V5 | $PV_5$ | $VT_5$ | 4.5 |
| Y+1 | 00101111 | +Vm | | | 4.6 |
| ... | ... | ... | | | 4.7 |
| Z-2 | 00110110 | +Vn | | | ... |
| Z-1 | 00110111 | +Vo | | | 5.4 5.48($PPV_7$) |
| Z (e.g., 56) | 00111000 | V7 | $PV_7$ | $VT_7$ | 5.5 |
| Z+1 | 00111001 | +Vp | | | 5.6 |
| ... | ... | ... | | | 5.7 |

600

601, 602, 605, 607

FIG. 6

NON-VOLATILE MEMORY PROGRAMMING

BACKGROUND

Non-volatile memory devices such as flash memory devices are used in many computers and electronic devices to store data. A flash memory device usually has a programming operation to store data, a read operation to retrieve the stored data, and an erase operation to clear data from the memory.

Conventional programming operations may involve causing the memory cells to be programmed to have certain states and then determining whether those states are within their expected target programmed states. The programming operation may repeat until expected target programmed states are obtained.

In some conventional programming operations, determining the states of the memory cells being programmed can be a challenge.

BRIEF DESCRIPTION OF THE DRAWINGS

FIG. 6 is a chart showing a relationship among values of some information and signals shown in FIG. 5, according to an embodiment of the invention.

DETAILED DESCRIPTION

Figure 1:
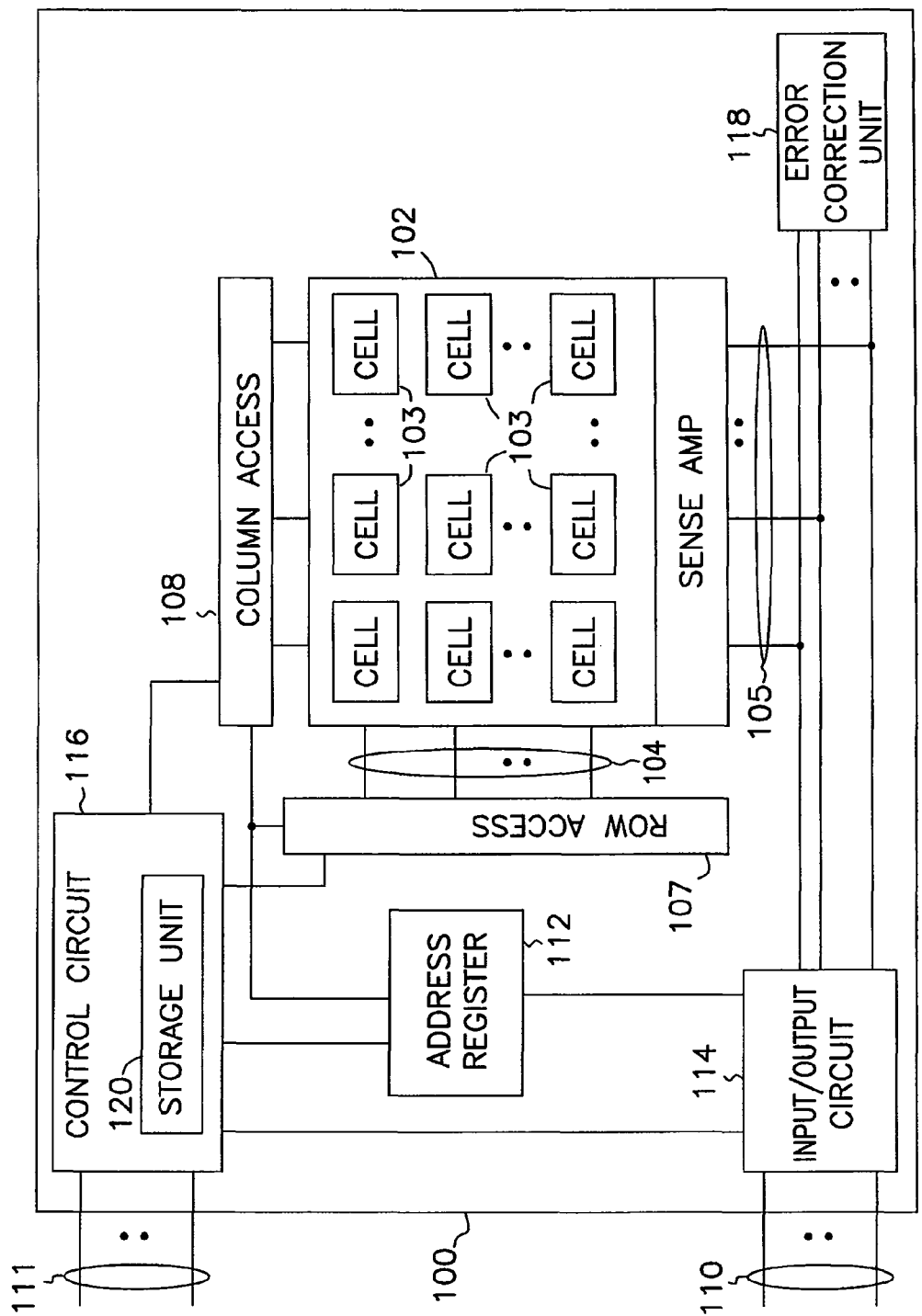
FIG. 1 shows a block diagram of a memory device, according to an embodiment of the invention.

FIG. 1 shows a block diagram of a memory device 100, according to an embodiment of the invention. Memory device 100 includes a memory array 102 with memory cells 103 that may be arranged in rows and columns along with access lines 104 and sense lines 105. Memory device 100 can use access lines 104 to access memory cells 103 and sense lines 105 to transfer data with memory cells 103. Row access 107 and column access circuitry 108 respond to an address register 112 to access memory cells 103 based on row address and column address signals on terminals 110, 111, or both. A data input/output circuit 114 transfers data between memory cells 103 and terminals 110. Terminals 110 and 111 may be external terminals of memory device 100 (e.g., terminals exposed outside a chip or semiconductor package that contains memory device 100).

A control circuit 116 controls operations of memory device 100 based on signals present on terminals 110 and 111. A device (e.g., a processor or a memory controller) external to memory device 100 may send different commands (e.g., programming commands and read commands) to memory device 100 using different combinations of signals on terminals 110, 111, or both.

Memory device 100 responds to commands to perform operations such as programming, read, and erase operations. A programming operation may write data from terminals 110 to memory cells 103 (e.g., transfer data from terminals 110 to memory cells 103). The programming operation can generally be called a write operation. A read operation reads data from memory cells 103 to terminals 110 (e.g., transfers data from memory cells 103 to terminals 110). An erase operation erases data (e.g., clears data) from all memory cells 103 or from a portion of memory cells 103.

Memory device 100 may include an error correction unit 118 to check for errors in data read from memory cells 103. Error correction unit 118 may include error correction circuitry to correct errors based on an error correction code (ECC), as is well-known to those of ordinary skill in the art.

Memory device 100 may include a storage unit 120, which may include memory elements such as registers. Storage unit 120 may include a hardware portion, a firmware portion, or both, of memory device 100. Storage unit 120 may also be used to store codes (e.g., software programming instructions).

Memory device 100 can be a flash memory device such as a NAND flash or a NOR flash memory device, or other kinds of memory devices.

Memory device 100 can be a single-level-cell memory device such that memory cells 103 store a single bit of data. For example, memory cells 103 may store either a binary "0" value or a binary "1" value of a single bit of data.

Memory device 100 can be a multi-level-cell (MLC) memory device such that each of memory cells 103 can store multiple bits or portions of bits of data (e.g., a value corresponding to two, three, four, or some other number of bits of data). For example, when each of memory cells 103 corresponds to a 2-bit per cell, each of memory cells 103 may store one of four possible combinations of two binary bits of data (i.e., combination 00, 01, 10, and 11 corresponding to two bits of data). In another example, when each of memory cells 103 corresponds to a 3-bit per cell, each of memory cells 103 may store one of eight possible combinations of three binary bits of data (i.e., one of 000, 001, 010, 011, 100, 101, 110, and 111). In another example, when each of memory cells 103 corresponds to a four-bit per cell, each of memory cells 103 may store one of 16 possible combinations of four binary bits of data (i.e., one of 0000, 0001, 0010, 0011, 1000, and so on, up to 1111).

Single level and MLC memory devices may be combined within the device 100. One of ordinary skill in the art will readily recognize that memory device 100 can include other parts, which are omitted from FIG. 1 to help focus on the various embodiments described herein. Memory device 100 may include one or more of the embodiments described below with reference to FIG. 2 through FIG. 9.

Figure 2:
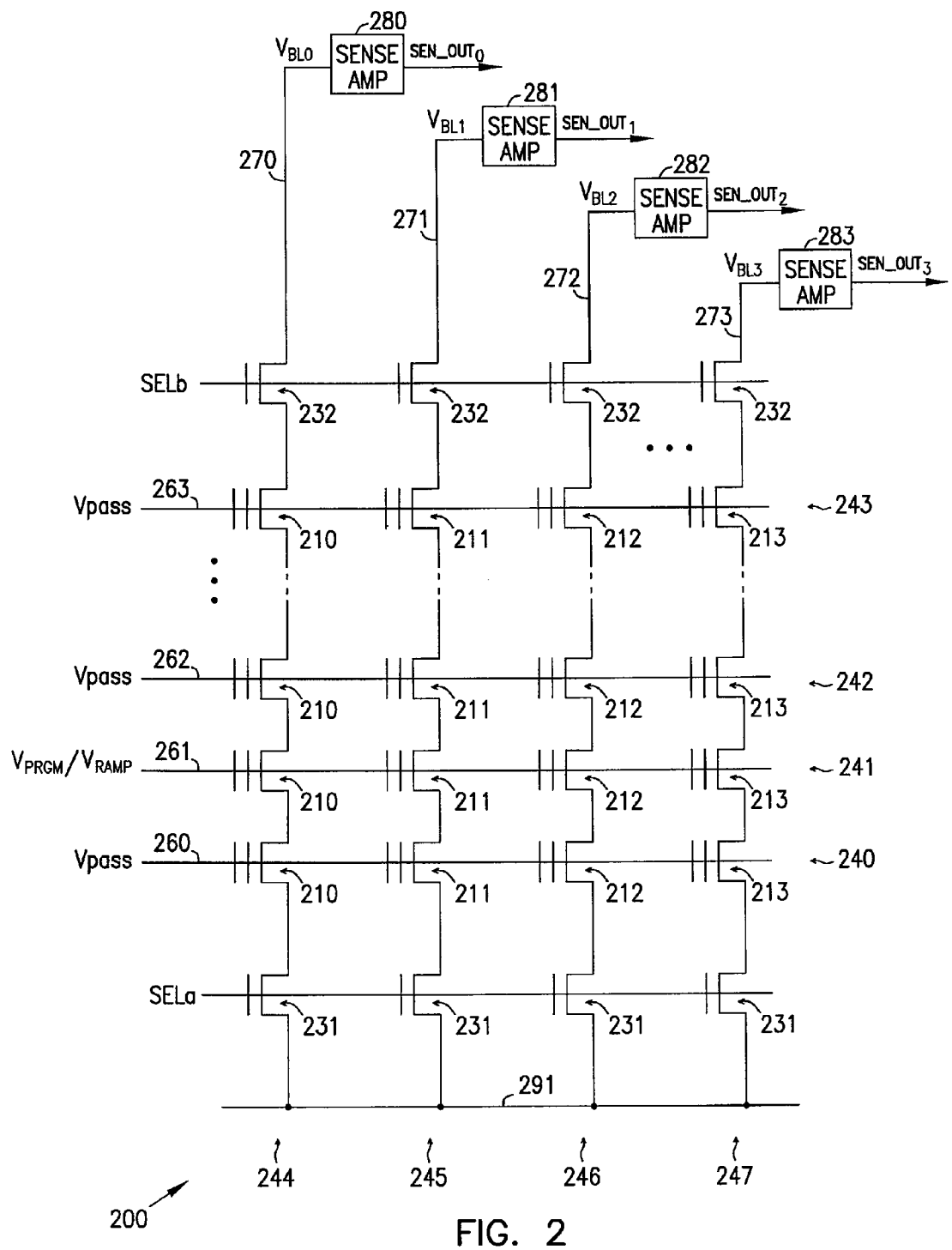
FIG. 2 shows a partial schematic diagram of a memory device, according to an embodiment of the invention.

FIG. 2 shows a partial schematic diagram of a memory device 200, according to an embodiment of the invention. Memory device 200 can be associated with memory device 100 of FIG. 1, such as forming a portion of memory array 102 of memory device 100. In FIG. 2, memory device 200 includes memory cells 210, 211, 212, and 213, arranged in rows 240, 241, 242, and 243, and columns 244, 245, 246, and 247. Memory cells in the same column may be connected in a series (sometimes called a string) of memory cells in their respective column, as illustrated in FIG. 2. FIG. 2 shows an example of four rows and four columns with four memory cells in each column. The number of rows, columns, and memory cells may vary.

As shown in FIG. 2, the memory cells in the same row (e.g., row 241) can be coupled to one of access lines 260, 261, 262, and 263. These access lines can correspond to portions of word lines of a memory device, and in at least some instances can form control gates for the memory cells. Memory device 200 uses access lines 260, 261, 262, and 263 to access memory cells 210, 211, 212, and 213 during a read operation to sense (e.g., read) data stored in memory cells 210, 211, 212, and 213, and during a programming operation to store (e.g., program or write) data into memory cells 210, 211, 212, and 213. Memory device 200 uses sense lines 270, 271, 272, and 273 to transfer the data read from memory cells 210, 211, 212, and 213 during a read operation.

Memory device 200 can also include transistors 231 and 232 (responsive to signals SELa and SELb, respectively) to couple the memory cells 210, 211, 212, and 213 in columns 244, 245, 246, and 247 to sense lines 270, 271, 272, and 273, respectively. Sense lines 270, 271, 272, and 273 may correspond to portions of bit lines, data lines, or a combination of these lines, of a memory device. Line 291 may correspond to a portion of a source (e.g., voltage) line of a memory device.

Memory device 200 can include sense amplifiers (SENSE AMP) 280, 281, 282, and 283 associated with their respective sense lines 270, 271, 272, and 273, which can carry signals $V_{BL0}$, $V_{BL1}$, $V_{BL2}$, and $V_{BL3}$, respectively. These sense amplifiers can individually perform a sense operation to respectively sense values of signals $V_{BL0}$, $V_{BL1}$, $V_{BL2}$, and $V_{BL3}$ and provide signals $SEN\_OUT_1$, $SEN\_OUT_2$, $SEN\_OUT_2$, and $SEN\_OUT_3$ indicating sense result information based on the result of the sense operation. The sense operation can be performed during a portion of a programming operation.

Memory device 200 can store data into memory cells 210, 211, 212, and 213 in a programming operation. The data stored in a particular memory cell (e.g., one of memory cells 210, 211, 212, and 213) can be indicated by a state of the memory cell, for example, the threshold voltage value of that particular memory cell, the charge stored by that particular cell, and/or a resistance state of that particular cell. For a multi-level-cell memory device, each memory cell can be programmed to have a respective programmed state to represent each possible combination of multiple bits that can be stored in each memory cell. For example, when each of memory cells 210, 211, 212, and 213 corresponds to a 3-bit per cell, each of memory cells 210, 211, 212, and 213 can be programmed to have a threshold voltage value within one of eight different threshold voltage ranges to represent a value corresponding to one of eight possible combinations of three binary bits of data (i.e., one of 000, 001, 010, 011, 100, 101, 110, and 111).

In the description herein, selected memory cells refer to the memory cells that are selected to store data in a particular programming operation. A selected access line refers to the access line associated with the selected memory cells. Unselected memory cells refer to the memory cells that are not selected to store data in that particular programming operation. Unselected access lines refer to the access lines associated with the unselected memory cells. The values (e.g., values corresponding to a memory address) of the signals on terminals, such as terminals 110 and 111 of FIG. 1, can be used to determine which memory cells are selected for programming in a programming operation.

FIG. 2 shows an example where one or more of memory cells 210, 211, 212, and 213 in row 241 can be selected memory cells during a programming operation and access line 261 can be a selected access line for these memory cells. In this example, memory cells 210, 211, 212, and 213 in rows 240, 242, and 243 are unselected memory cells. Access lines 260, 262, and 263 are unselected access lines.

During a programming operation, memory device 200 may apply a signal Vpass to unselected access lines (e.g., 260, 262, and 263) associated with unselected memory cells. Signal Vpass can have a value such that the unselected memory cells can maintain their states and operate as pass elements (e.g., by conducting current) during a programming operation. As an example, signal Vpass can have a value of approximately ten volts.

During a programming operation, memory device 200 may apply different signals (e.g., voltage signals) $V_{PRGM}$ and $V_{RAMP}$ at different times to the same selected access line (e.g., 261). Memory device 200 applies signal (e.g., voltage signals) $V_{PRGM}$ to a selected access line (e.g., 261) to change the states (e.g., change the threshold voltage value) of selected memory cells associated with the selected access line. While signal $V_{PRGM}$ is applied to the selected access line, memory device 200 may also apply signals (e.g., voltage signals) $V_{BL0}$, $V_{BL1}$, $V_{BL2}$, and $V_{BL3}$ to sense lines 270, 271, 272, and 273, respectively, associated with the selected memory cells. The value of $V_{BL0}$, $V_{BL1}$, $V_{BL2}$, and $V_{BL3}$ can be different among each other, depending on the states (e.g., threshold voltage values) of the selected memory cells at various times during the programming operation. Some or all signals $V_{BL0}$, $V_{BL1}$, $V_{BL2}$, and $V_{BL3}$ can have a value of zero volts (e.g., ground). Applying signals $V_{BL0}$, $V_{BL1}$, $V_{BL2}$, and $V_{BL3}$ with different values based on the states of the selected memory cells during programming may allow memory device 200 to adjust a programming rate (e.g., how fast or slow) at which the selected memory cells are programmed.

Memory device 200 can include a verify operation, which can be a part of the programming operation. During the verify operation memory device 200 applies signal $V_{RAMP}$ to a selected access line to determine (e.g., check) whether selected memory cells are near their respective target states (e.g., near target threshold voltage values) or have reached their respective target states. The state of the memory cell can include a threshold voltage value of the memory cell. While signal $V_{RAMP}$ is applied to the selected access line, sense amplifiers 280, 281, 282, and 283 can perform sense operations to sense the value of corresponding signals $V_{BL0}$, $V_{BL1}$, $V_{BL2}$, and $V_{BL3}$ associated with the selected memory cells. Before the sensing (e.g., at the beginning of the verify operation), selected sense lines 270, 271, 272, and 273 can be charged (e.g., precharged), such that signal $V_{BL0}$, $V_{BL1}$, $V_{BL2}$, and $V_{BL3}$ can have a particular predetermined signal level value (e.g., high). During the sensing, the signal level value may change (e.g., decrease) or may stay at the same signal level value, based on the states of an associated selected memory cell.

The sense result information, provided by signals $SEN\_OUT_0$, $SEN\_OUT_1$, $SEN\_OUT_2$, and $SEN\_OUT_3$, can indicate whether the selected memory cells are near or have reached their respective target states. Based on the sense result information, memory device 200 may perform appropriate activities. The activities can include adjusting (e.g., decreasing) a programming rate and repeat programming any particular selected memory cell if that memory cell is near its target state. The activities can include increasing the programming rate of the memory cell if the memory cell is not near the target state and has not reached the target state. The activities can also include finishing programming (e.g., inhibiting) any particular selected memory cell if that memory cell has reached its target state.

Figure 3:
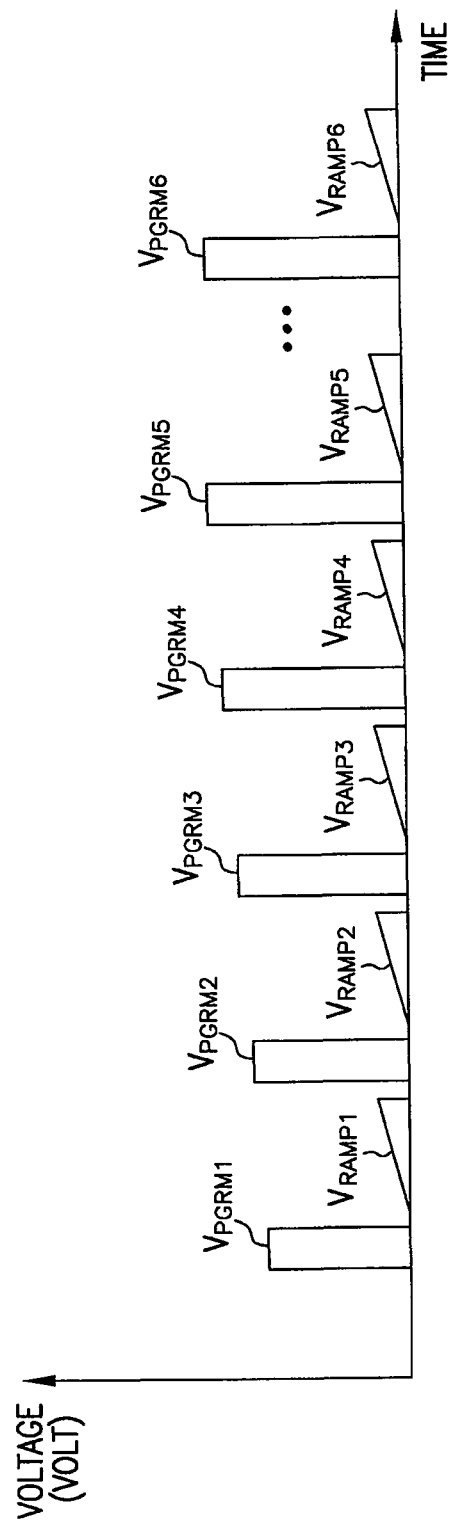
FIG. 3 shows a diagram illustrating example values of various signals applied to an access line associated with selected memory cells during a programming operation of the memory device of FIG. 2, according to an embodiment of the invention.

FIG. 3 shows a diagram illustrating example values of signals $V_{PGRM1}$ through $V_{PGRM6}$ and signals $V_{RAMP1}$ through $V_{RAMP6}$ applied to an access line associated with selected memory cells during a programming operation of the memory device 200 of FIG. 2, according to an embodiment of the invention. The same signal $V_{RAMP}$ between two consecutive $V_{PGRM}$ can be used for multiple selected memory cells in the same row to determine whether the selected memory cells are near their respective target states or have reached their respective target states.

Each of signals $V_{PGRM1}$ through $V_{PGRM6}$ in FIG. 3 corresponds to signal $V_{PGRM}$ of FIG. 2. Each of signals $V_{RAMP1}$ through $V_{RAMP6}$ in FIG. 3 corresponds to signal $V_{RAMP}$ of FIG. 2. FIG. 3 shows six signals $V_{PGRM1}$ through $V_{PGRM6}$ and six signals $V_{RAMP1}$ through $V_{RAMP6}$ as an example. The number of these signals during a particular programming operation can vary (e.g., fewer or more than six).

As shown in FIG. 3, each of signals $V_{PGRM1}$ through $V_{PGRM6}$ can include only a single programming pulse. One pulse can have a different amplitude value from that of the next pulse. For example, the amplitude values of signal $V_{PGRM1}$ through $V_{PGRM6}$ can have a range from approximately 15 volts to approximately 20 volts. During a programming operation, one or more of signals $V_{PGRM1}$ through $V_{PGRM6}$ can be applied to a selected access line to program an associated selected memory cell until the selected memory cell reaches its target threshold voltage value. For example, if after signal $V_{PGRM1}$ is applied and a selected memory cell has not reached its target threshold voltage value, then the programming operation can be repeated with signal $V_{PGRM2}$. If after signal $V_{PGRM2}$ is applied and the selected memory cell has not reached its target threshold voltage value, then the programming operation can be repeated with one or more of signals $V_{PGRM3}$ through $V_{PGRM6}$ until the target threshold voltage value is reached.

Each time the programming operation repeats programming a memory cell, the value (amplitude value) of the signal on the selected access line associated with the selected memory can increase. For example, FIG. 3 shows an increase in amplitude value from signal $V_{PGRM1}$ to signal $V_{PGRM2}$, from signal $V_{PGRM2}$ to signal $V_{PGRM3}$, and so on. Alternatively, the amplitude value can remain the same.

In FIG. 3, a verify operation can be performed after an application of each of signals $V_{PGRM1}$ through $V_{PGRM6}$. In a verify operation, one of the signals $V_{RAMP1}$ through $V_{RAMP6}$ can be applied to the same selected access line to which one of the signals $V_{PGRM1}$ through $V_{PGRM6}$ was applied. For example, signal $V_{RAMP1}$ can be applied to selected access line 216 (FIG. 2) after signal $V_{PGRM1}$ is applied to selected access line 216. Signal $V_{RAMP2}$ can be applied to selected access line 216 after signal $V_{PGRM2}$ is applied to selected access line 216. The number of signals $V_{RAMP1}$ through $V_{RAMP6}$ can be equal to the number of signals $V_{PGRM1}$ through $V_{PGRM6}$ during programming of the selected memory cell.

As shown in FIG. 3, signals $V_{RAMP1}$ through $V_{RAMP6}$ can have the same profile. For example, signals $V_{RAMP1}$ through $V_{RAMP6}$ can have amplitude values increasing in the same direction (e.g., positive slope) with respect to time. As shown in FIG. 3, signals $V_{RAMP1}$ through $V_{RAMP6}$ can have a single ramp shape with values increasing from zero (or negative value) to a positive voltage, for example, approximately six volts (or higher).

When one of signals $V_{RAMP1}$ through $V_{RAMP6}$ is applied to a selected access line during a verify operation, memory device 200 may perform two activities for each memory cell being programmed. One activity can include determining whether the threshold voltage value of the memory cell reaches a value less than (but near) its target threshold voltage. Another activity can include determining whether the threshold voltage value of the memory cell has reached its target threshold voltage. Based on the determining results from these two activities, memory device 200 can further perform additional activities, such as to repeat or finish programming of some or all of selected memory cells.

Figure 4:
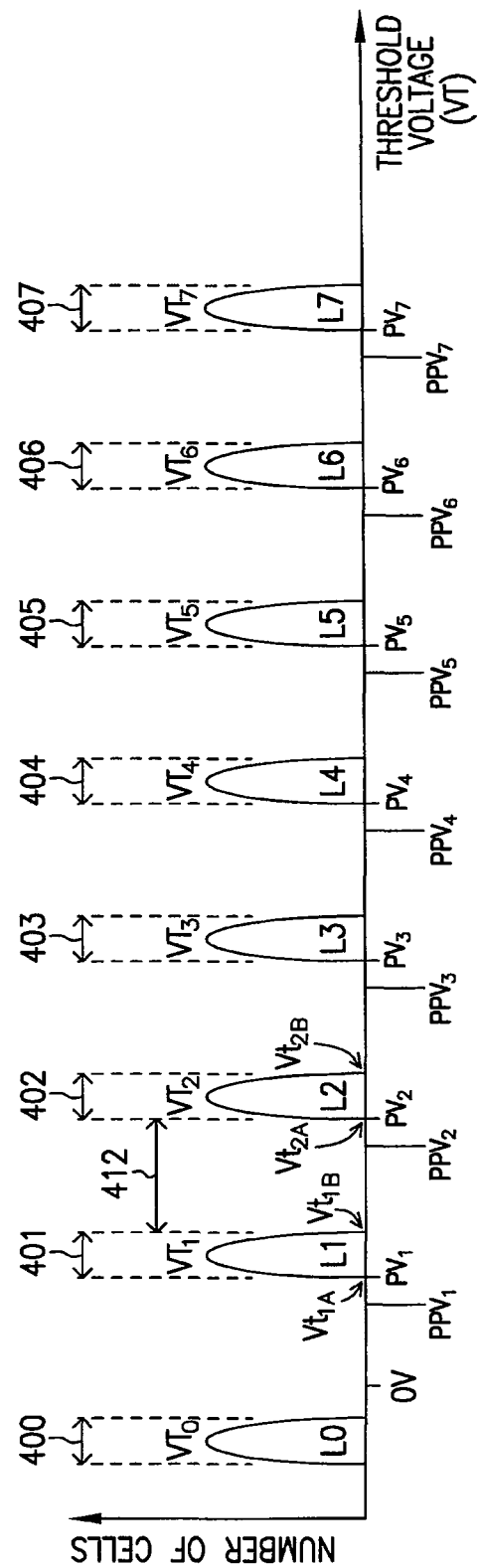
FIG. 4 shows an example of threshold voltage value ranges of corresponding threshold voltages of the memory device of FIG. 2, according to an embodiment of the invention.

FIG. 4 shows an example of threshold voltage value ranges 400 through 407 of corresponding threshold voltages $VT_0$ through $VT_7$ of memory device 200 of FIG. 2, according to an embodiment of the invention. As described above, memory device 200 can be a multi-level cell memory device. For example, memory device 200 can be a 3-bit per cell memory device. There are eight possible combinations of three bits. FIG. 4 shows eight levels (sometimes called states), level 0 (L0) through level 7 (L7) corresponding to eight different combinations of three bits. Each level has a voltage threshold value range for a corresponding threshold voltage for a large number of memory cells. For example, levels L0 through L7 have respective ranges for values of threshold voltages, labeled threshold voltage $VT_0$ through $VT_7$. As shown in FIG. 4, the threshold voltage values of threshold voltages $VT_0$ through $VT_7$ goes from a lowest threshold voltage value (corresponding level 0) to a highest threshold voltage value (corresponding to level L7). Thus, the threshold value of threshold voltage $VT_7$ is greatest among the threshold voltage values of threshold voltages $VT_0$ through $VT_7$.

Each of threshold voltages $VT_0$ through $VT_7$ can be a target threshold voltage. During a programming operation, a selected memory cell can be programmed to have a target threshold voltage value within the value range of one of threshold voltages $VT_0$ through $VT_7$.

As shown in FIG. 4, threshold voltage $VT_1$ can have threshold voltage value range 401, ranging from a lower limit value $Vt_{1A}$ to a higher limit value $Vt_{1B}$. Threshold voltage $VT_2$ can have threshold voltage value range 402, ranging from a lower limit value $Vt_{2A}$ to a higher limit value $Vt_{2B}$. Zone 412 is the difference in value between higher limit value $Vt_{1B}$ of voltage value range 401 and lower limit value $Vt_{2A}$ of threshold voltage value range 402. As an example, zone 412 can be approximately 800 millivolts (mV). Other threshold voltages $VT_0$ and $VT_3$ through $VT_7$ can also have corresponding voltage value ranges 400 and 403 through 407. For clarity, FIG. 4 omits the labels for lower and higher limit values associated with ranges 400 and 403 through 407.

FIG. 4 also shows pre-program verify voltage $PPV_i$ and program verify voltage $PV_i$ where index "i" corresponds to the level number. Each of threshold voltages $VT_0$ through $VT_7$ is associated with a pair of verify voltages $PPV_i$ and $PV_i$. For example, threshold voltage $VT_2$ is associated with verify voltages $PPV_2$ and $PV_2$. Threshold voltage $VT_5$ is associated with verify voltages $PPV_5$ and $PV_5$.

The difference in values between $PPV_i$ and $PV_i$ (or $PV_i - PPV_i$) associated with a particular threshold voltage $VT_i$ can be less than one-fourth of the difference between the lower limit value of that threshold voltage $VT_i$ and the higher limit value associated with the threshold voltage $VT_i$ that is immediately below that particular threshold voltage $VT_i$. For example, in FIG. 4, if zone 412 is approximately 800 mV, then $PV_2 - PPV_2$ can be less than 200 mV. Alternatively, the difference in values between $PV_i - PPV_i$ can be from at least one-fourth to one-half of the difference between the lower limit value of that level and the higher limit value of the level immediately below that level. For example, in FIG. 4, if zone 412 is approximately 800 mV, then $PV_2 - PPV_2$ and be from 200 mV to 400 mV.

During a verify operation, a selected memory cell can be deemed to have reached a value (e.g., $PPV_i$) less than but near its target threshold voltage value if the threshold voltage value (Vt) during programming of that memory cell is equal to or greater than its associated $PPV_i$ (e.g., $Vt \geq PPV_i$). A selected memory cell is deemed to have reached its target Vt if the threshold voltage value of that memory cell during programming of that memory cell is equal to or greater than its associated $PV_i$ (e.g., $Vt \geq PV_i$).

In the description herein, condition $Vt \geq PPV_i$ refers to a condition of whether the threshold voltage value (Vt) of a particular selected memory cell reaches a value (e.g., $PPV_i$) less than its target threshold voltage value during programming of that memory cell. Condition $Vt \geq PV_i$ refers to a condition of whether the threshold voltage value of a particular selected memory cell has reached its target threshold voltage value during programming of that memory cell.

Figure 5:
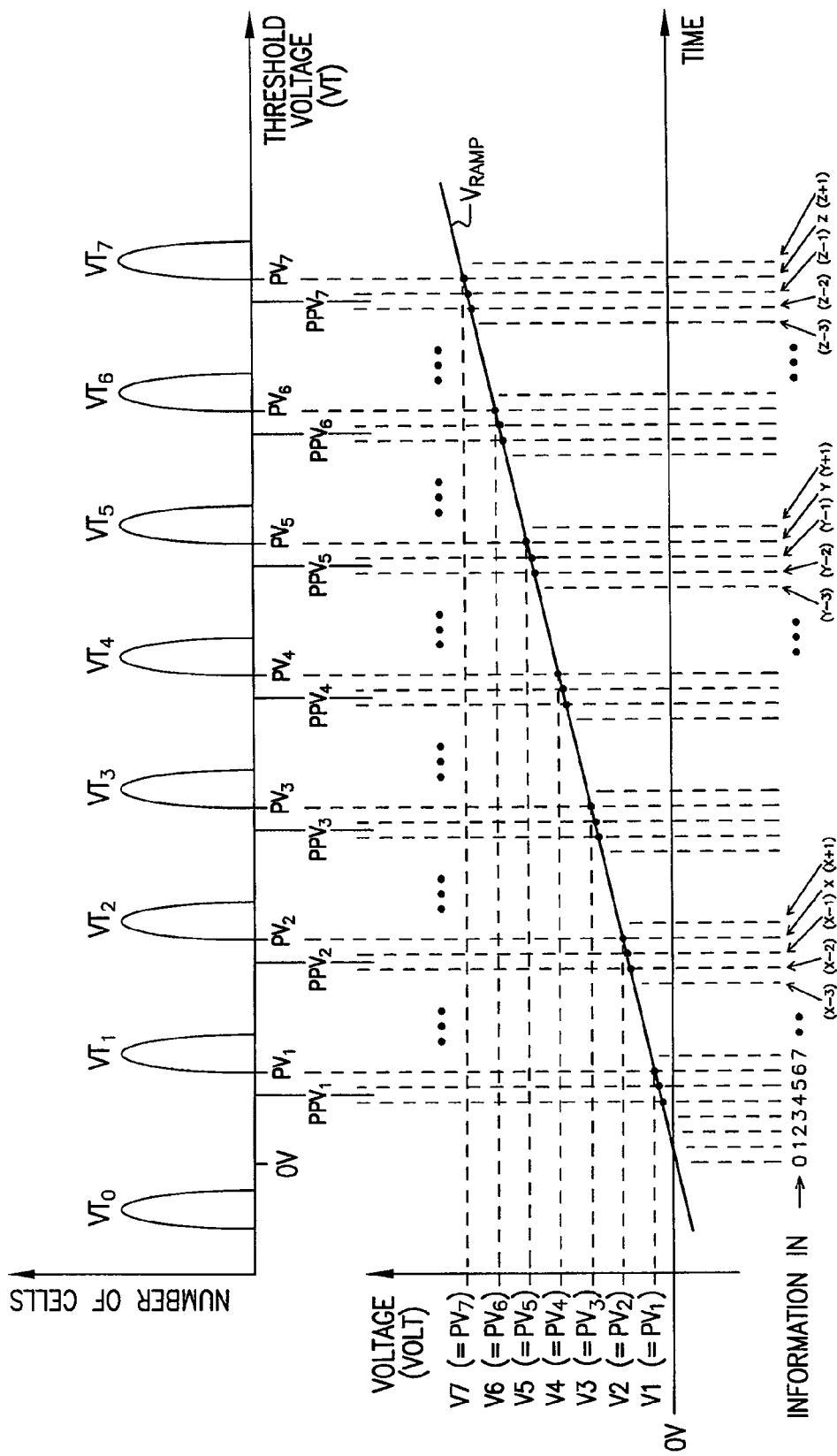
FIG. 5 shows graphs illustrating a relationship between values of threshold voltages and a signal shown in FIG. 3 and FIG. 4, according to an embodiment of the invention.

FIG. 5 shows graphs illustrating a relationship between values of threshold voltages $VT_0$ through $VT_7$ and signal $V_{RAMP}$, according to an embodiment of the invention. Signal $V_{RAMP}$ can correspond to signal $V_{RAMP}$ of FIG. 2 and any one of signals $V_{RAMP1}$ through $V_{RAMP6}$ in FIG. 4. Thus, each of signals $V_{RAMP1}$ through $V_{RAMP6}$ in FIG. 4 can have a profile shown in FIG. 5, such as a single ramp shape with a positive slope.

As shown in FIG. 5, signal $V_{RAMP}$ can include values V1, V2, V3, V4, V5, V6 and V7 equal to voltages $PV_1$ through $PV_7$, respectively. The maximum value of $V_{RAMP}$ can be greater than the higher limit of a threshold voltage value range associated with threshold voltage $VT_7$. $V_{RAMP}$ can be generated based on values of input information (IN).

Information IN can be digital information. Information IN can be generated by components of memory device 200, such as control circuit 116 of FIG. 1. A digital-to-analog converter (DAC) can be used to receive information IN at its input and generate values V1 through V7 of signal $V_{RAMP}$ at its output, based on information IN.

As shown in FIG. 5, information IN can include values (e.g., numbers) generated in a sequential order. For example, information IN can include numbers generated in a sequential order (in decimal number presentation) of 0, 1, 2, 3, 4, 5, 6, 7, . . . , X−3, X−2, X−1, X, X+1, . . . , Y−3, Y−2, Y−1, Y, Y+1, . . . , Z−3, Z−2, Z−1, Z, and Z+1. Only some of the values of information IN are shown in FIG. 5 for clarity. Value Z is greater than value Y, and value Y is greater than value X.

For each value (e.g., digital value) of information IN, a corresponding value (e.g., analog voltage value) of signal $V_{RAMP}$ can be generated. For example, value V1 (voltage value) of signal $V_{RAMP}$ can be generated based on value 6 (e.g., 00000110 in an 8-bit binary number representation) of information IN. In another example, value V2 of signal $V_{RAMP}$ can be generated based on value X (e.g., X=00000110 in binary representation if X=16) of information IN.

As shown in FIG. 5, the value of signal $V_{RAMP}$ corresponding to value X−2 can be less than voltage value $PVV_2$. The value of signal $V_{RAMP}$ corresponding to value Y−2 can be less than voltage value $PVV_5$. The value of signal $V_{RAMP}$ corresponding to value Z−2 can be less than voltage value $PVV_7$.

The value of signal $V_{RAMP}$ corresponding to value X can be equal to voltage value $PV_2$. The value of signal $V_{RAMP}$ corresponding to value Y can be equal to voltage value $PV_5$. The value of signal $V_{RAMP}$ corresponding to value Z can be equal to voltage value $PV_7$.

Each of voltages $PPV_i$ can have a value between consecutive values of signal $V_{RAMP}$ that are generated by two consecutive values of information IN. For example, consecutive values X−2 and X−1 of information IN are used to generate two corresponding consecutive values (shown as two dots) of signal $V_{RAMP}$. As shown in FIG. 5, voltage $PPV_2$ is between these two values of signal $V_{RAMP}$. This means that voltage $PPV_2$ is greater than a voltage value of signal $V_{RAMP}$ generated by value X−2 of information IN and less than a voltage value of signal $V_{RAMP}$ generated by value X−1 of information IN. In another example, consecutive values Y−2 and Y−1 of information IN are used to generate two corresponding consecutive values (shown as two dots) of signal $V_{RAMP}$. As shown in FIG. 5, voltage $PPV_5$ is between these two values of signal $V_{RAMP}$. This means that voltage $PPV_2$ is greater than a voltage value of signal $V_{RAMP}$ generated by value Y−2 of information IN and less than a voltage value of signal $V_{RAMP}$ generated by value Y−1 of information IN. Alternatively, each of voltages $PPV_i$ can have a value equal to a value of signal $V_{RAMP}$ that is generated by a corresponding value of information IN. For example, voltage $PPV_2$ can have a value equal to a value of signal $V_{RAMP}$ generated by value X−2 of information IN.

FIG. 6 is a chart 600 showing a relationship among values of information IN, signal $V_{RAMP}$, voltage $PV_i$, and target threshold voltages $V_{T0}$ through $VT_7$ of FIG. 5, according to an embodiment of the invention. In chart 600, information IN is presented in two different forms, a decimal form and a corresponding binary form. For example, if information IN includes an 8-bit binary number, then its value of zero (in decimal form) corresponds to 00000000, value 1 corresponds to 00000001, value 16 corresponds to 00010000, and so on.

For each value of information IN, chart 600 also shows examples of the corresponding value of voltage $PV_i$ (which corresponds to target $VT_i$). For example, as shown in portions

601, 602, 605, and 607, values 00000110, 00010000, 00101110, and 00111000 of information IN can correspond to the values of voltage $PV_i$ (target $VT_1$), $PV_2$ (target $VT_2$), $PV_5$ (target $VT_5$), and $PV_7$ (target $VT_7$), respectively.

As described above with reference to FIG. 5, each of voltages $PPV_i$ can have a value between consecutive values of signal $V_{RAMP}$ that are generated by two consecutive values of information IN. Chart 600 of FIG. 6 shows an example where voltage $PPV_i$ has a value of 0.48 volt (V), which is between 0.4V and 0.5V volt of signal $V_{RAMP}$ that are generated by consecutive values 00000100 and 00000101 of information IN. In another example, chart 600 also shows voltage $PPV_5$ having a value of 4.48V, which is between 4.4V and 4.5V of signal $V_{RAMP}$ that are generated by consecutive values 00101100 and 00101101 of information IN. Values 0.48V, 1.48V, 4.48V, and 5.48V are only examples. Other values for $PPV_i$ can be used. For example, in chart 600, voltage $PPV_1$ can have any value greater than 0.4V and less than 0.5V. Similarly, voltage $PPV_2$ can have any value greater than 1.4V and less than 1.5V. Voltage $PPV_5$ can have any value greater than 4.4V and less than 4.5V. Voltage $PPV_7$ can have any value greater than 5.4V and less than 5.5V.

For the example of chart 600, during a verify operation, if a selected memory cell is programmed to have a target threshold voltage value of $PV_2$, the selected memory cell is deemed to have reached a value of $PPV_2$ (e.g., 1.48V) if the threshold voltage value Vt during programming of that memory cell is equal to or greater than 1.48V. The selected memory cell is deemed to have reached its target Vt (e.g., 1.6V) if the threshold voltage value of that memory cell during programming of that memory cell is equal to or greater than 1.6V.

Each of values (in volt unit) V1 through V7 and other values (e.g., positive voltage values Va through Vp) of signal $V_{RAMP}$ can be generated based on a corresponding value of information IN. For example, values V1, V2, V5, and V7 of signal $V_{RAMP}$ can be generated based on corresponding values of information IN, such as values 00000110 (or 6 in decimal form), 00010000 (or X in decimal form), 00101110 (or Y in decimal form), and 00111000 (or Z in decimal form).

As shown in FIG. 6, information IN can have values in an increasing sequential order, such as from 0 to Z+1. The values of signal $V_{RAMP}$ can also have an increasing sequential order, such as from zero volts to 5.7V, corresponding to the same order of that of information IN. The increment from one value to the next value of signal $V_{RAMP}$ can be the same, such as 100 millivolts (or 0.1 volt) or other values.

Figure 7:
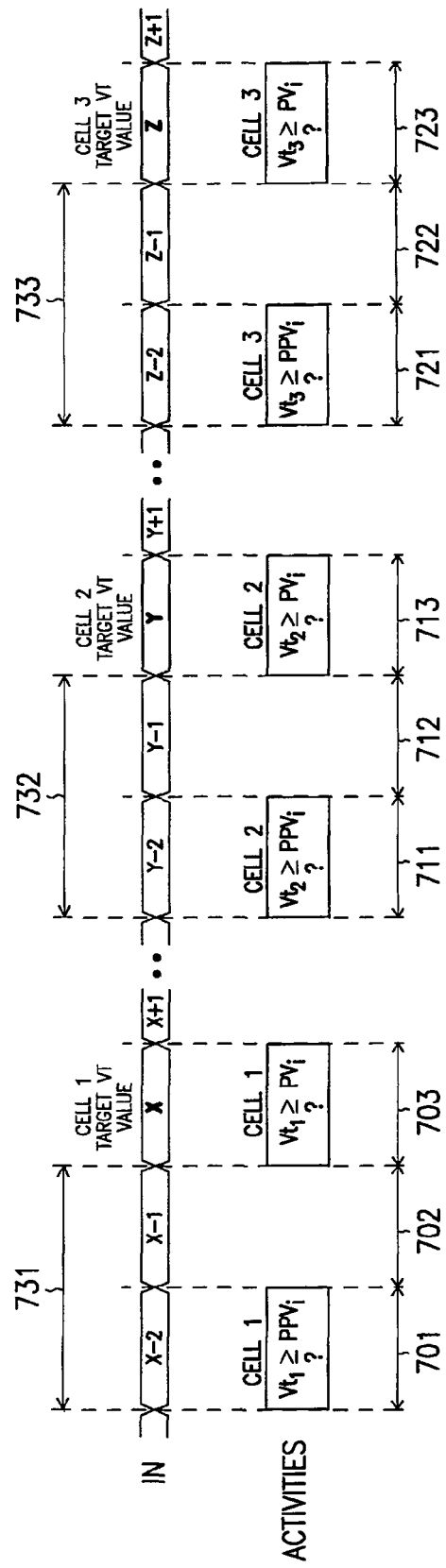
FIG. 7 shows some activities performed by the memory device of FIG. 2 based on the values of information shown in FIG. 5 and FIG. 6 during an example programming of some selected memory cells of the memory device, according to an embodiment of the invention.

FIG. 7 shows some activities performed by memory device 200 of FIG. 2 based on the values of information IN of FIG. 5 and FIG. 6 during an example programming of selected memory cells 1, 2, and 3 of a memory device, according to an embodiment of the invention. Memory cells 1, 2, and 3 can be in the same row, such as memory cells 210, 212, and 213 in row 241 of FIG. 2.

In FIG. 7, the values of information IN can be generated one after another at different time intervals in a sequential order during a verify operation. For example, values X−2, X−1, and X can be generated during time intervals 701, 702, and 703, respectively. Values Y−2, Y−1, and Y can be generated during time intervals 711, 712, and 713, respectively. Values Z−2, Z−1, and Z can be generated during time intervals 721, 722, and 723, respectively. Values X, Y, and Z can correspond to three different target threshold voltage values.

As shown in FIG. 7, offset values 731, 732, and 733 are the differences between values X and X−2, between values Y and Y−2, and between values Z and Z−2, respectively. Offset values 731, 732, and 733 can be the same. FIG. 7 shows an example where offset values 731, 732, and 733 are two units (count units) with respect to the sequential unit of information IN. For example, if X=16 then, the sequence shown in FIG. 7 would be 14, 15, 16, and 17 (in decimal number representation) or 00001110, 00001111, 00010000, and 00010001 (in 8-bit binary number representation). Thus, offset 731 is two units (two count units). Similarly, as shown in FIG. 7, each of offset values 732 and 733 is also two units. Other offset value units can be used. For example, offset values 731, 732, and 733 can be one unit or more than two units.

In the example of FIG. 7, memory cells 1, 2, and 3 are programmed to have threshold voltage values $Vt_1$, $Vt_2$, and $Vt_3$, respectively, corresponding to values X, Y, and Z. During the programming operation in this example, memory device 200 determines whether $Vt \geq PPV_i$ for memory cells 1, 2, and 3 when the values of information IN are X−2, Y−2, and Z−2, respectively, at corresponding time intervals 701, 711, and 721. Memory device 200 also determines whether $Vt \geq PV_i$ for memory cells 210, 212, and 213 when the values of information IN are X, Y, and Z, respectively, at corresponding time intervals 703, 713, and 723. Based on the determining results from these activities, memory device 200 can further perform additional activities, such as adjusting a programming rate and repeat programming after time interval 723 or finishing the programming of selected memory cells 1, 2, and 3, after time interval 723.

Figure 8:
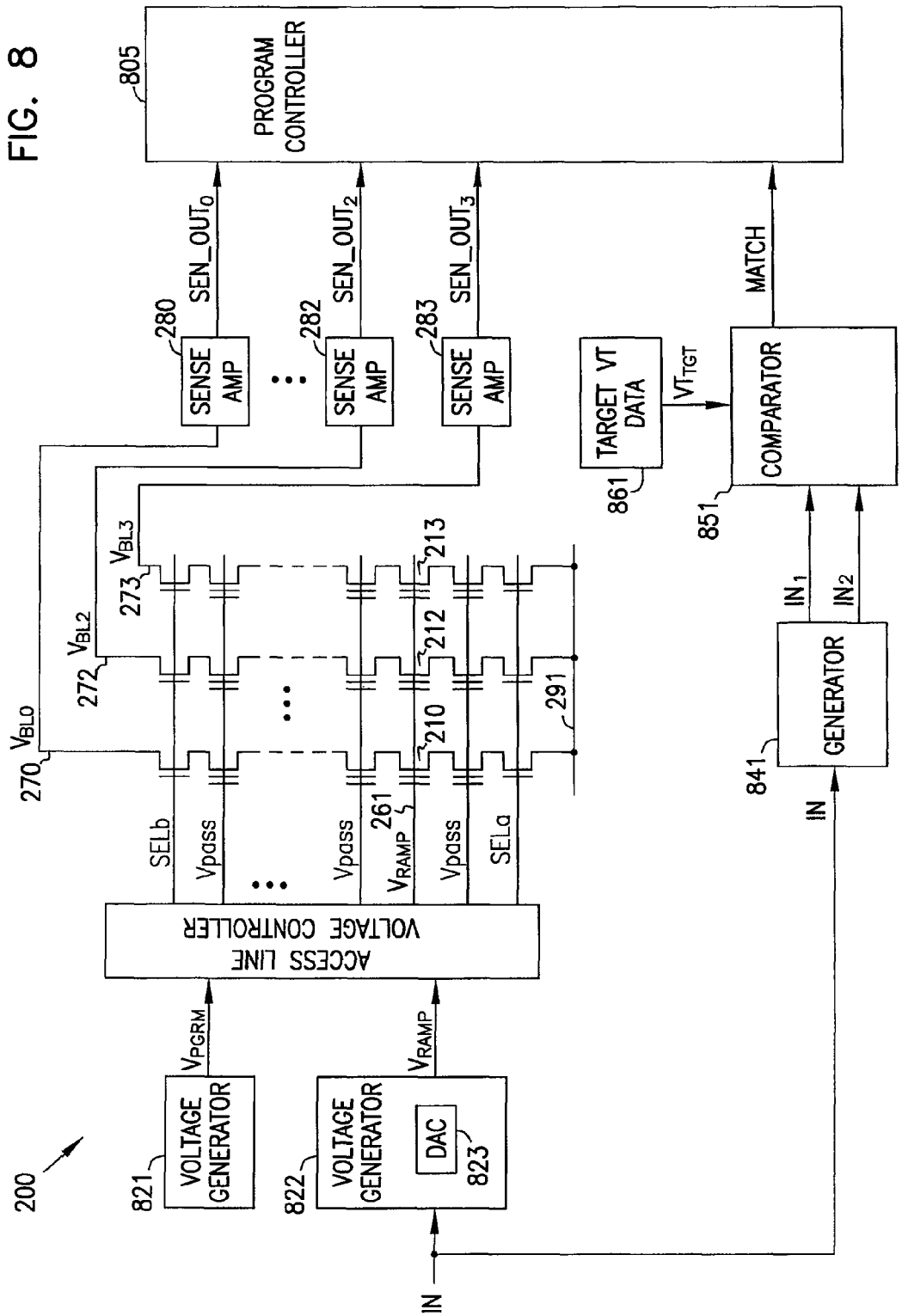
FIG. 8 shows a partial schematic diagram of another portion of the memory device of FIG. 2, according to an embodiment of the invention.

FIG. 8 shows a partial schematic diagram of another portion of memory device 200 of FIG. 2, according to an embodiment of the invention. For simplicity, FIG. 8 omits some elements and some reference labels of memory device 200.

As shown in FIG. 8, memory device 200 can include voltage generators 821 and 822 to generate signals $V_{PGRM}$ and $V_{RAMP}$, respectively. Signal $V_{PGRM}$ in FIG. 8 can include one or more of signals $V_{PGRM1}$ through $V_{PGRM6}$ in FIG. 3. Signal $V_{RAMP}$ in FIG. 8 can include one or more of signals $V_{RAMP1}$ through $V_{RAMP6}$ in FIG. 3.

Voltage generator 821 may include a charge pump to provide signal $V_{PGRM}$, which can have a value greater than the supply voltage (e.g., Vcc) of memory device 200. Voltage generator 822 may include a digital to analog converter (DAC) 823 to generate signal $V_{RAMP}$. DAC 823 may receive information IN in the form of combinations of bits at its input and generate signal $V_{RAMP}$ at its output with values (e.g., analog value) corresponding to the combinations of the bits. Some example values of information IN and signal $V_{RAMP}$ are shown in FIG. 5 and FIG. 6.

Memory device 200 in FIG. 8 can also include a generator 841 to receive information IN and generate information IN1 and information IN2 based on information IN. Generator 841 can include any combination of logic gate elements, counters, or other components. Each of information IN1 and IN2 can be digital information. The relationship among information IN, IN1, and IN2 are described in detail with reference to FIG. 9.

Memory device 200 can also include a target Vt data unit 861 to store information $VT_{TGT}$ corresponding to target threshold voltage values to be programmed into selected memory cells during a particular programming operation.

A comparator 851 of memory device 200 can compare information $VT_{TGT}$ with each of information IN1 and IN2 during a verify operation and provide a comparison result. The value of a signal MATCH can be used to indicate a value of the comparison result. For example, the signal MATCH can have one value (e.g., high, logic one, or other values) when either IN1=$VT_{TGT}$ or IN2=$VT_{TGT}$, the signal MATCH can have another value (e.g., low, logic zero, or other values) when neither IN1=$VT_{TGT}$ nor IN2=$VT_{TGT}$.

A programming controller 805 receives a combination of signal MATCH and signals $SEN\_OU_{T1}$, $SEN\_OU_{T2}$, and SEN_OU$_{T3}$. Based on this combination, programming controller 805 can determine whether conditions Vt≥PPV$_i$ and Vt≥PV$_i$ are satisfied when information IN has specific values. These specific values can include values X−2, X, Y−2, Y, Z−2, and Z of information IN.

Programming controller 805 may include storage components, e.g., latches, to store information provided by signal MATCH and signals SEN_OU$_{T1}$, SEN_OU$_{T2}$, and SEN_OU$_{T3}$. Based on the stored information, which includes information associated with conditions Vt≥PPV$_i$ and Vt≥PV$_i$, memory device 200 may perform further programming activities. For example, memory device 200 may adjust (e.g., decrease) a programming rate and repeat programming of any particular selected memory cell if Vt≥PPV$_i$ for that memory cell is satisfied, or finish the programming of (e.g., inhibit) any particular selected memory cell if condition Vt≥PV$_i$ for that memory cell is satisfied.

Figure 9:
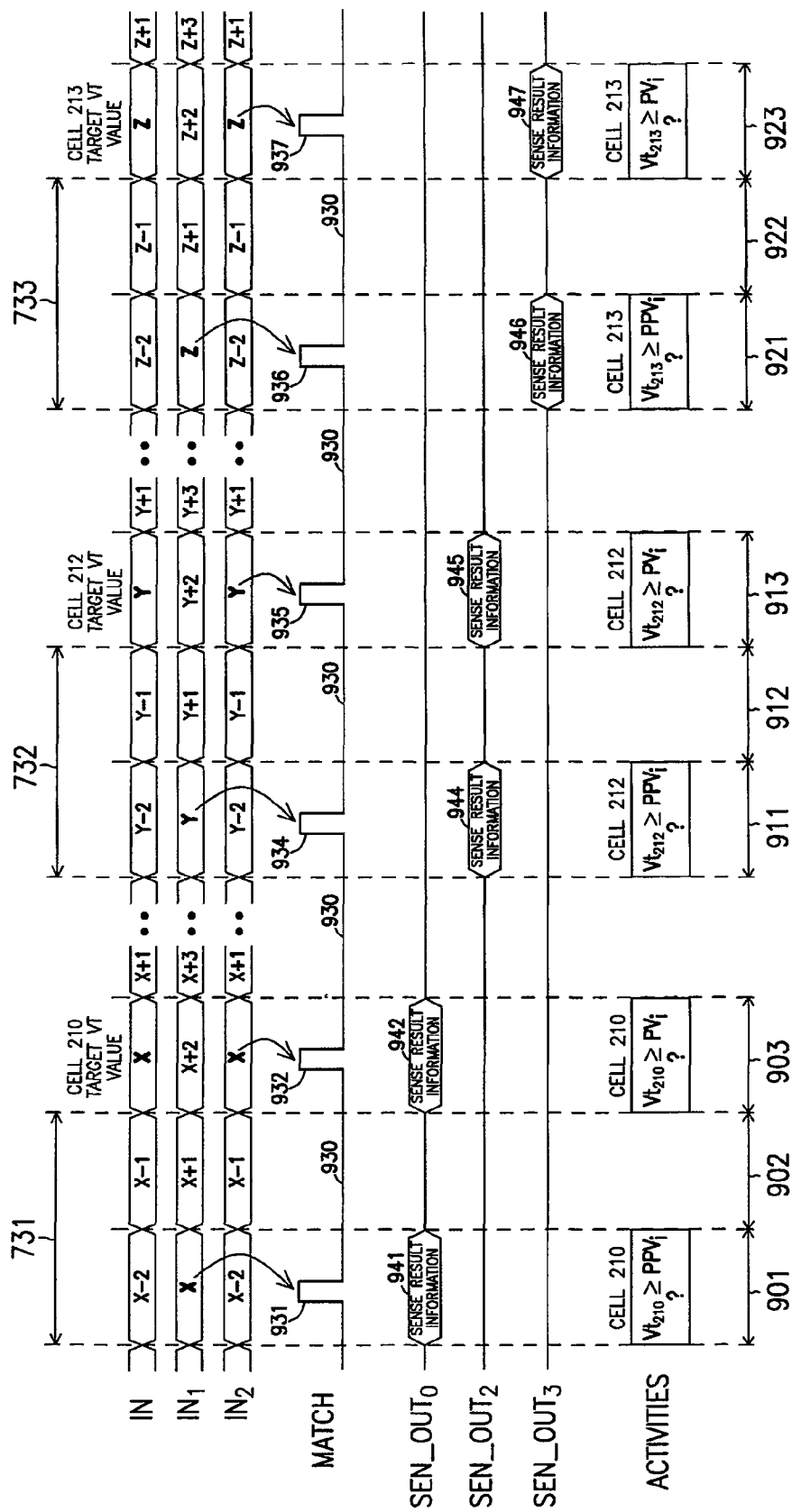
FIG. 9 is a graph showing activities of the memory device of FIG. 2 including determining some conditions during selected time intervals in an example programming of selected memory cells of FIG. 8, according to an embodiment of the invention.

FIG. 9 is a graph showing activities of memory device 200 including determining conditions Vt≥PPV$_i$ and Vt≥PV$_i$ during some time intervals in an example programming of memory cells 210, 212, and 213 of FIG. 8, according to an embodiment of the invention. As shown in FIG. 9, memory cells 210, 212, and 213 can be programmed to have target threshold voltage values corresponding to values X, Y, and Z of information IN. During an example programming operation associated with FIG. 9, the threshold voltage values of memory cells 210, 212, and 213 are indicated as Vt$_{210}$, Vt$_{212}$, and Vt$_{213}$, respectively. In this example, information VT$_{TGT}$ corresponding to target threshold voltage values stored in target VT data unit 861 (FIG. 8) can include values corresponding to values X, Y, and Z of information IN.

As shown in FIG. 9, each value (e.g., number) of information IN1 can be generated based on a corresponding value (e.g., number) of information IN plus an offset value, such as offset value 731, 732, or 733. For example, if IN=X−2, X−1, X then IN1=X, X+1, X+2. In this example (offset value=2), if X=16, when IN1=X−2=14 (e.g., 00001110), IN=(X−2)+2=X=16 (e.g., 00010000). Similarly, as shown in FIG. 9, if IN=Y−2, Y−1, Y then IN1=Y, Y+1, Y+2. If IN=Z−2, Z−1, Z then IN1=Z, Z+1, Z+2.

The value of information IN2 can be equal to the value of information IN. For example, if IN=X−2, X−1, X then IN2=X−2, X−1, X. In this example, if X=16, when IN=X−2=14 (e.g., 00001110), IN2=X−2=14 (e.g., 00001110). Similarly, as shown in FIG. 9, if IN=Y−2, Y−1, Y then IN2=Y−2, Y−1, Y. If IN=Z−2, Z−1, Z then IN2=Z−2, Z−1, Z.

Since the value of information Ni can be equal to the value of information IN plus an offset value (e.g., IN1=IN+offset value) and the value of information IN2 can be equal to the value of information IN (e.g., IN2=IN), the value of information IN1 can also be equal to the value of information IN2 plus the offset value (e.g., IN1=IN2+offset value). For example, as shown in FIG. 9, if IN2=X−2, X−1, X then IN1=X, X+1, X+2. If IN2=Y−2, Y−1, Y then IN1=Y, Y+1, Y+2. If IN2=Z−2, Z−1, Z then IN1=Z, Z+1, Z+2.

Signal MATCH can have signal level values to provide information including three different types of indications. For example, one signal level value (e.g., low) of signal MATCH can be used to indicate an unmatch indications 930. Another signal level value (e.g., high) of signal MATCH can be used to indicate near target match indications 931, 934, or 936 and target match indications 932, 935, or 937.

Memory device 200 may determine whether Vt≥PPV$_i$ for respective memory cells 210, 212, and 213 during each occurrence of near target match indications 931, 934, and 936 during time intervals 901, 911, and 921. Memory device 200 may determine whether Vt≥PV$_i$ for respective memory cells 210, 212, and 213 during each occurrence of target match indications 932, 935, and 937 during time intervals 903, 923, and 933. For example, as shown in FIG. 9, memory device 200 may determine whether Vt$_{210}$≥PPV$_i$ and Vt$_{210}$≥PV$_i$ for memory cell 210 during time intervals 901 and 903, respectively, when near target match indication 931 and target match indications 932 occur. Memory device 200 may determine whether Vt$_{212}$≥PPV$_i$ and Vt$_{212}$≥PV$_i$ for memory cell 212 during time intervals 911 and 913, respectively, when near target match indication 934 and target match indications 935 occur. Memory device 200 may determine whether Vt$_{213}$≥PPV$_i$ and Vt$_{213}$≥PV$_i$ for memory cell 213 during time intervals 921 and 923, respectively, when near target match indication 936 and target match indications 937 occur.

Memory device 200 may ignore sense result information of respective memory cells 210, 212, and 213 when unmatch indications 930 occur during time intervals 902, 912, and 922. In each of time intervals 901, 902, 903, 911, 912, 913, 921, 922, and 923, memory device 200 may enable (e.g., activate) the sense amplifiers associated with the selected memory cells, such as sense amplifiers 280, 282, and 283 (FIG. 8) associated with selected memory cells 210, 212, and 213. Sense amplifiers 280, 282, and 283, when enabled, perform the sense operation in each of time intervals 901, 902, 903, 911, 912, 913, 921, 922, and 923. However, because of the occurrence of unmatch indications 930 during time intervals 902, 912, and 922, memory device 200 may ignore (e.g., may not store) sense result information obtained during time intervals 902, 912, and 922.

Near target match indications 931, 934, and 936 can be provided based on the value of information IN1. For example, as shown in FIG. 9, signal MATCH provides near target match indications 931, 934, and 936 when the values of information IN1 are X, Y, and Z, respectively.

Target match indications 932, 935, and 937 can be provided based on the value of information IN2. For example, as shown in FIG. 9, signal MATCH provides target match indications 932, 935, and 937 when the values of information IN2 are X, Y, and Z, respectively.

Thus, near target match indications 931, 934, and 936, and target match indications 932, 935, and 937 occur when either the value of information Ni or the value of information IN2 is equal to the target threshold voltage values X, Y, and Z. At each occurrence of near target match indications 931, 934, and 936, and each occurrence of target match indications 932, 935, and 937, memory device 200 may obtain sense result information 941, 942, 944, 945, 946, and 947 provided by signals SEN_OUT$_0$, SEN_OUT$_2$, and SEN_OUT$_3$, respectively. During a programming operation, programming controller 805 (FIG. 8) may store indications 931, 932, 934, 935, 936 and 937, and sense result information 941, 942, 944, 945, 946, and 947.

Based on the sense result information associated with each of memory cells 210, 212, and 213 and the information provided by signal MATCH, memory device 200 may determine whether conditions Vt≥PPV$_i$ and Vt≥PV$_i$ are satisfied. For example, during time interval 901, condition Vt≥PPV$_i$ associated with memory cell 210 is satisfied if sense result information provided by signal SEN_OUT$_0$ has one value (e.g., high, logic one, or other value). In this example, condition Vt≥PPV$_i$ is unsatisfied if sense result information provided by signal SEN_OUT$_0$ has another value (e.g., low, logic zero, or other value). In another example, during time interval 903, condition Vt$_{210}$≥PV$_i$ associated with memory cell 210 is satisfied if sense result information provided by signal SEN_OUT$_0$ has one value (e.g., high, logic one, or other value). In this example, condition Vt$_{210}$≥PV$_i$ is unsatisfied if sense result information provided by signal SEN_OUT$_0$ has another value (e.g., low, logic zero, or other value).

In a similar fashion, during interval 911, condition Vt$_{212}$≥PPV$_i$ associated with memory cell 212 is satisfied if sense result information provided by signal SEN_OUT$_2$ has one value (e.g., high, logic one, or other value) and is unsatisfied if sense result information provided by signal SEN_OUT$_2$ has another value (e.g., low, logic zero, or other value). During time interval 913, condition Vt$_{212}$≥PV$_i$ associated with memory cell 212 is satisfied if sense result information provided by signal SEN_OUT$_2$ has one value and is unsatisfied if sense result information provided by signal SEN_OUT$_2$ has another value.

During interval 921, condition Vt$_{213}$≥PPV$_i$ associated with memory cell 213 is satisfied if sense result information provided by signal SEN_OUT$_3$ has one value (e.g., high, logic one, or other value) and is unsatisfied if sense result information provided by signal SEN_OUT$_3$ has another value (e.g., low, logic zero, or other value). During time interval 923, condition Vt$_{213}$≥PV$_i$ associated with memory cell 213 is satisfied if sense result information provided by signal SEN_OUT$_3$ has one value and is unsatisfied if sense result information provided by signal SEN_OUT$_3$ has another value.

Figure 10:
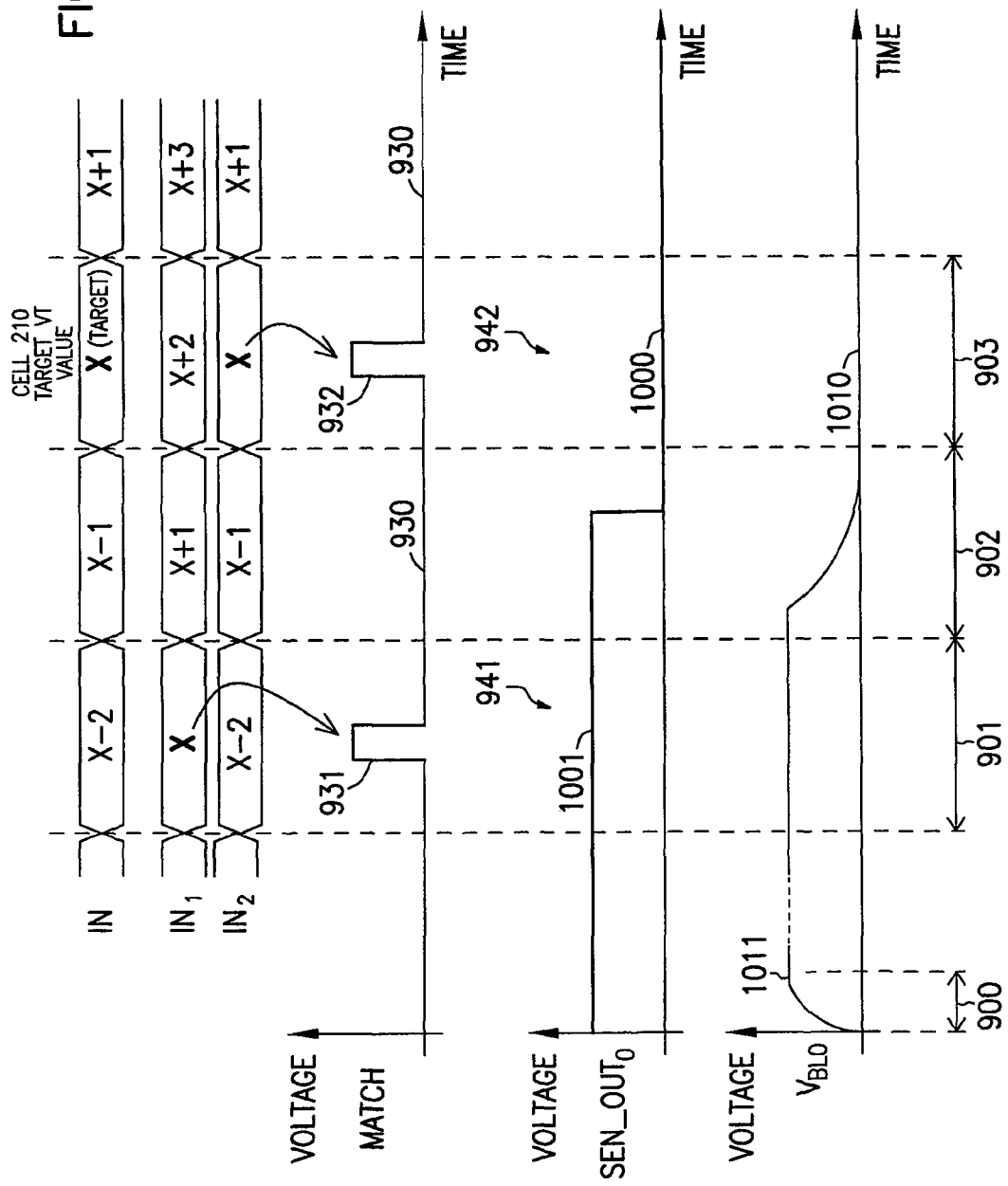
FIG. 10 is a graph showing a first example of some signals associated with a first memory cell in the example programming operation described with reference to FIG. 9, according to an embodiment of the invention.

FIG. 10 is a graph showing a first example of signal SEN_OUT$_0$ and signal V$_{BL0}$ associated with memory cell 210 in the example programming operation described with reference to FIG. 9, according to an embodiment of the invention. As shown in FIG. 10, sense result information 941 and 942 (also shown in FIG. 9) during time intervals 901 and 903, respectively, can have different values. For example, sense result information 941 has a value corresponding to one signal level value 1001 (e.g., high) of signal SEN_OUT$_0$. Sense result information 942 has a value corresponding to another signal level value 1000 (e.g., low).

FIG. 10 shows an example where signal SEN_OUT$_0$ has signal level value 1001 during time interval 901, indicating that condition Vt$_{210}$≥PPV$_i$ is satisfied. FIG. 10 also shows an example where signal SEN_OUT$_0$ has signal level value 1000 during time interval 903, indicating that condition Vt$_{210}$≥PV$_i$ is unsatisfied.

The signal level values of signal SEN_OUT$_0$ are based on the signal level values of signal V$_{BL0}$. Sense amplifier 280 (FIG. 8) can operate such that signal level values of signal SEN_OUT$_0$ follow the signal level values of signal V$_{BL0}$. For example, during time interval 901 in FIG. 10, the signal level value of signal SEN_OUT$_0$ is high when the signal level value of signal V$_{BL0}$ is high (e.g., value 1011). During time interval 903, the signal level value of signal SEN_OUT$_0$ is low when the signal level value of signal V$_{BL0}$ is low (e.g., value 1010).

The signal level values of signal V$_{BL0}$ shown in FIG. 10 can depend on an amount of charge (e.g., voltage) on sense line 270 (FIG. 8). The following description refers to FIG. 8 and FIG. 10. At a beginning of the verify operation before time intervals 901, 902, and 903, such as during time interval 900 in FIG. 10, sense line 270 can be charged (e.g., precharged) to a voltage (e.g., Vcc) such that signal V$_{BL0}$ has signal level value 1011. Time interval 900 can be greater than each of time intervals 901, 902, and 903. For simplicity, the time intervals (e.g., 900, 901, 902, and 903) in FIG. 10 and in FIG. 11 through FIG. 14 are not scaled. Time interval 900 can be sufficient to allow sense line 270 to reach the charged voltage (e.g., Vcc) before the sensing operation at time interval 901. Depending on the threshold voltage value Vt$_{210}$ of memory cell 210 and the value of signal V$_{RAMP}$ on access line 216 (FIG. 8) during time intervals 901, 902, and 903, sense line 270 may maintain the charge (e.g., at Vcc) or may discharge to line 291 during any of time intervals 901, 902, and 903.

Sense line 270 may maintain the charge if Vt$_{210}$ is greater than the value of signal V$_{RAMP}$ (V$_{210}$≥V$_{RAMP}$). For example, if Vt$_{210}$≥V$_{RAMP}$, a transistor in memory cell 210 does not turn on (e.g., remain in an off-state). Thus, no signal path (e.g., current path) is formed from sense line 270 to line 291 through memory cell 210. Since no signal is formed, sense line 270 may maintain its charge at substantially the same value (e.g., Vcc).

Sense line 270 may discharge to line 291 if Vt$_{210}$ is equal to or less than the value of signal V$_{RAMP}$ (Vt$_{210}$≤V$_{RAMP}$) during any of time intervals 901, 902, and 903. For example, if Vt$_{210}$≤V$_{RAMP}$ 901, the transistor in memory cell 210 turns on. Thus, a signal path is formed from sense line 270 to line 291 through memory cell 210. Since a signal path is formed, sense line 270 may discharge to line 291 via the signal path. The discharging may reduce the charge on sense line 270 to zero or near zero.

FIG. 10 shows an example where Vt$_{210}$≥V$_{RAMP}$ during time interval 901 and Vt$_{210}$≤V$_{RAMP}$ during time intervals 902 and 903. For example, if Vt$_{210}$=1.48V and V$_{RAMP}$=1.4V (Vt$_{210}$≥V$_{RAMP}$) during time interval 901, then the transistor in memory cell 210 does not turn on. Thus, during time interval 901, no signal path is formed from sense line 270 to line 291 through memory cell 210. Therefore, the charge on sense line 270 remains at substantially the same value (e.g., Vcc). As shown in FIG. 10, signal V$_{BL0}$ stays the same signal level value 1011 (e.g., high) from time interval 900 to time interval 901, indicating that the charge on sense line 270 remains at substantially the same value when Vt$_{210}$≥V$_{RAMP}$. Since signal V$_{BL0}$ has signal level value 1011 (e.g., high), signal SEN_OUT$_0$ also has a corresponding signal level value 1001 (e.g., high), indicating that condition Vt$_{210}$≥PPV$_i$ is satisfied.

In the above example, the value of signal V$_{RAMP}$ may increase from 1.4V during time interval 901 to 1.5V (for example) during time interval 902 and then to 1.6V (for example) during time interval 903. The example values of 1.4V, 1.5V, and 1.6V described here can also correspond to the example values of V$_{RAMP}$ shown in chart 600 of FIG. 6. During time interval 902 in FIG. 10, since Vt$_{210}$≤V$_{RAMP}$ (e.g., Vt$_{210}$=1.4V≤V$_{RAMP}$=1.5V), the transistor in memory cell 210 turns on. Sense line 270 may discharge to line 291. As shown in FIG. 10, during time interval 902, signal V$_{BL0}$ changes from signal level value 1011 (e.g., high) to signal level value 1010 (e.g., low). This indicates that sense line 270 begins to discharge to line 291 during time interval 902 when Vt$_{210}$≤V$_{RAMP}$. Since signal V$_{BL0}$ changes from signal level value 1011 (e.g., high) to signal level value 1010 (e.g., low) during time interval 902, signal SEN_OUT$_0$ also changes from signal level value 1001 (e.g., high) to signal level value 1000 (e.g., low) during time interval 902.

During time interval 903, since Vt$_{210}$≤V$_{RAMP}$ (e.g., Vt$_{210}$=1.4V≤V$_{RAMP}$=1.6V) as indicated in the above example, the transistor in memory cell 210 may remain turned on. Sense line 270 may continue to discharge to line 291 or may come near the end of the discharging. As shown in FIG. 10, during time interval 903, signal V$_{BL0}$ has signal level value 1010 (e.g., low). This indicates that sense line 270 has been discharged to line 291 during time interval 903 when Vt$_{210}$≤V$_{RAMP}$. Since signal V$_{BL0}$ has signal level value 1010 (e.g., low) during time interval 903, signal SEN_OUT$_0$ also has a corresponding signal level value 1000 (e.g., low), indicating that condition Vt$_{210}$≥PV$_i$ is unsatisfied.

In the example of FIG. 10, memory device 200 repeats the programming of memory cell 210 because condition Vt$_{210}$≥PV$_i$ is unsatisfied. In this example, since condition $Vt_{210} \geq PPV_i$ is satisfied, indicating that the threshold voltage value of memory cell 210 is near the target threshold voltage value (e.g., $PV_2$), memory device 200 may adjust a programming rate at which memory cell 210 is programmed during a repeat of the programming of memory cell 210 to move it toward the target threshold voltage value. Adjusting such a programming rate may avoid over-programming of memory cell 210. For example, memory device 200 may adjust the programming rate by, for example, adjusting a voltage value applied to sense line 270 associated with memory cell 210 during the repeat of the programming of memory cell 210.

Adjusting such a voltage value can include increasing the voltage value applied to sense line 270. Increasing the voltage value applied to sense line 270 can include increasing from zero to a positive voltage value (e.g., 500 mV). For example, zero volts can be applied to sense line 270 during programming of memory cell 210 with a preceding programming pulse (e.g., $V_{PGRM2}$ in FIG. 3) when condition $Vt_{210} \geq PV_i$ is unsatisfied. In this example, the positive voltage value can be applied to sense line 270 during programming of memory cell 210 with a succeeding programming pulse (e.g., $V_{PGRM3}$ in FIG. 3) when condition $Vt_{210} \geq PV_i$ is satisfied. Increasing the voltage value applied to sense line 270 can alternatively include increasing the voltage value from a lower positive value (e.g., when $V_{PGRM2}$ in FIG. 3 is used) to a higher positive value (e.g., when $V_{PGRM3}$ in FIG. 3 is used during the repeat of the programming).

In an alternative programming operation, adjusting a voltage value applied to sense line 270 can include decreasing the voltage value applied to sense line 270 during a repeat of the programming of memory cell 210. For example, decreasing the voltage value applied to sense line 270 can include decreasing the voltage value from a positive voltage value to zero. For example, the positive voltage value can be applied to sense line 270 during programming of memory cell 210 with a preceding programming pulse (e.g., $V_{PGRM2}$ in FIG. 3) when condition $Vt_{210} \geq PV_i$ is unsatisfied. In this example, zero volts can be applied to sense line 270 during programming of memory cell 210 with a succeeding programming pulse (e.g., $V_{PGRM3}$ in FIG. 3) when condition $Vt_{210} \geq PV_i$ is unsatisfied. Decreasing the voltage value applied to sense line 270 can alternatively include decreasing the voltage value from a higher positive value (e.g., when $V_{PGRM2}$ in FIG. 3 is used) to a lower positive value (e.g., when $V_{PGRM3}$ in FIG. 3 is used during the repeat of the programming). In some cases, decreasing the voltage value applied to sense line 270 can be performed when only memory cell 210 has not reached its target threshold voltage value while other memory cells in the same row (e.g., row 241 in FIG. 2) have reached their respective target threshold voltage values.

Figure 11:
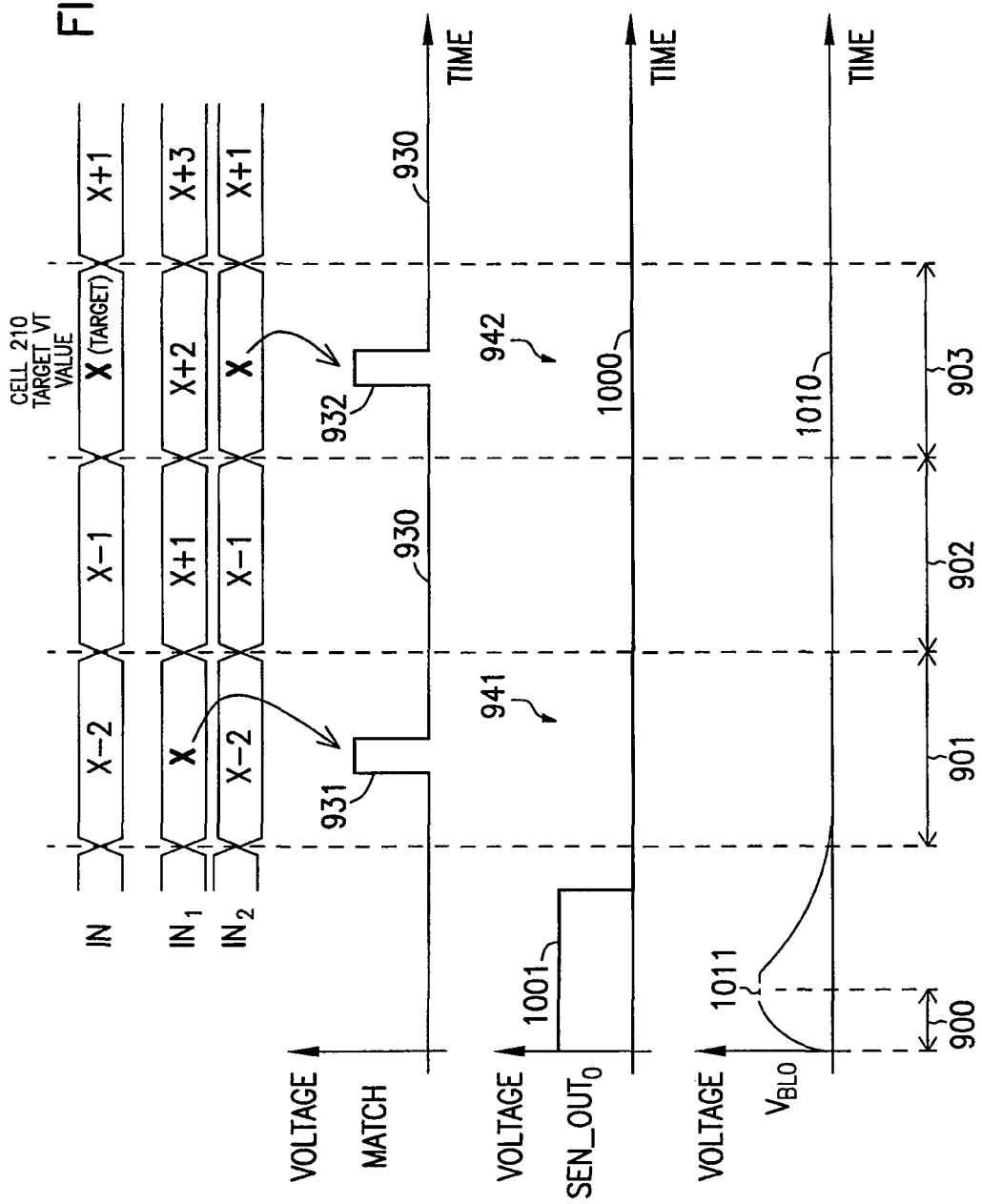
FIG. 11 is a graph showing a second example of some signals associated with the first memory cell in the example programming operation described with reference to FIG. 9, according to an embodiment of the invention.

FIG. 11 is a graph showing a second example of signal $SEN\_OUT_0$ and signal $V_{BL0}$ associated with memory cell 210 in the example programming operation described with reference to FIG. 9, according to an embodiment of the invention. As shown in FIG. 11, signal $SEN\_OUT_0$ has signal level value 1000 during time interval 901, indicating that condition $Vt_{210} \geq PPV_i$ is unsatisfied. FIG. 11 also shows that signal $SEN\_OUT_0$ has signal level value 1000 during time interval 903, indicating that condition $Vt_{210} \geq PV_i$ is unsatisfied.

In this example, during time intervals 901, 902, and 903, $Vt_{210} \leq V_{RAMP}$. Sense line 270 (FIG. 8) discharges to line 291. Thus, as shown in FIG. 11, signal $V_{BL0}$ has signal level value 1010 (e.g., low) during time intervals 901, 902, and 903. Therefore, signal $SEN\_OUT_0$ also has a corresponding signal level value 1000 (e.g., low) during time intervals 901, 902, and 903. This indicates that condition $Vt_{210} \geq PPV_i$ is unsatisfied during time interval 901 and condition $Vt_{210} \geq PV_i$ is unsatisfied during time interval 903.

In the example of FIG. 11, memory device 200 repeats the programming of memory cell 210 because condition $Vt_{210} \geq PV_i$ is unsatisfied. In this example, since condition $Vt_{210} \geq PPV_i$ is also unsatisfied, indicating that the threshold voltage value of memory cell 210 is not near the target threshold voltage value (e.g., $PV_2$), memory device 200 may not adjust the programming rate, such as by keeping a voltage value applied to sense line 270 line associated with memory cell 210 unchanged when the programming of memory cell 210 is repeated. For example, during a repeat of the programming associated with a succeeding programming pulse (e.g., $V_{PGRM3}$ in FIG. 3), memory device 200 may keep the voltage value applied to sense line 270 at the same value (e.g., at zero or at a positive value) that was used during a programming associated with a preceding programming pulse (e.g., $V_{PGRM2}$ in FIG. 3).

Figure 12:
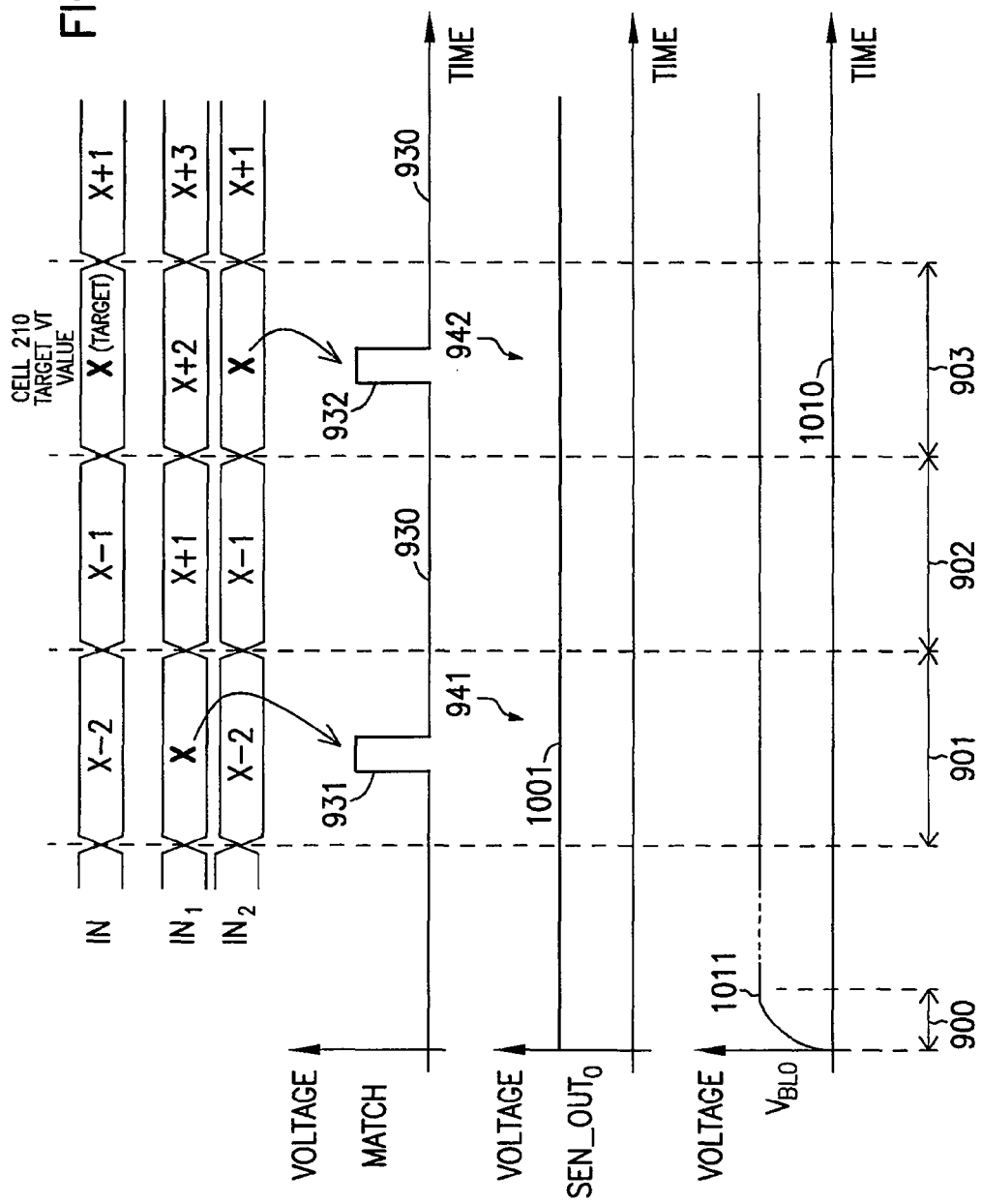
FIG. 12 is a graph showing a third example of some signals associated with a first memory cell in the example programming operation described with reference to FIG. 9, according to an embodiment of the invention.

FIG. 12 is a graph showing a third example of signal $SEN\_OUT_0$ and signal $V_{BL0}$ associated with memory cell 210 in the example programming operation described with reference to FIG. 9, according to an embodiment of the invention. As shown in FIG. 12, signal $SEN\_OUT_0$ has signal level value 1001 during time interval 901, indicating that condition $Vt_{210} \geq PPV_i$ is satisfied. FIG. 12 also shows that signal $SEN\_OUT_0$ has signal level value 1001 during time interval 903, indicating that condition $Vt_{210} \geq PV_i$ is also satisfied.

In this example, during time intervals 901, 902, and 903, $Vt_{210} \geq V_{RAMP}$. Sense line 270 (FIG. 8) maintains its charge during time intervals 901, 902, and 903. Thus, as shown in FIG. 11, signal $V_{BL0}$ has signal level value 1001 (e.g., high) during time intervals 901, 902, and 903. Therefore, signal $SEN\_OUT_0$ also has a corresponding signal level value 1001 (e.g., high) during time intervals 901, 902, and 903. This indicates that condition $Vt_{210} \geq PPV_i$ is satisfied during time interval 901 and condition $Vt_{210} \geq PV_i$ is satisfied during time interval 903.

In the example of FIG. 12, memory device 200 may finish programming of memory cell 210 because condition $Vt_{210} \geq PV_i$ is satisfied. In this example, memory device 200 may finish programming of memory cell 210 by, for example, applying an inhibit voltage value to sense line 270 line associated with memory cell 210. The inhibit voltage can have a value sufficient to prevent further programming of memory cell 210 even if other selected memory cells (212 and 213) in the same row of memory cell 210 have not reached their respective target threshold voltage values. For example, the inhibit voltage value can have a value equal to the value of the supply voltage (e.g., Vcc) of memory device 200. Memory device 200 may continue (e.g., repeat) programming of other memory cells, such as memory cells 212 and 213 if they have not reached their respective target threshold voltage values.

Figure 13:
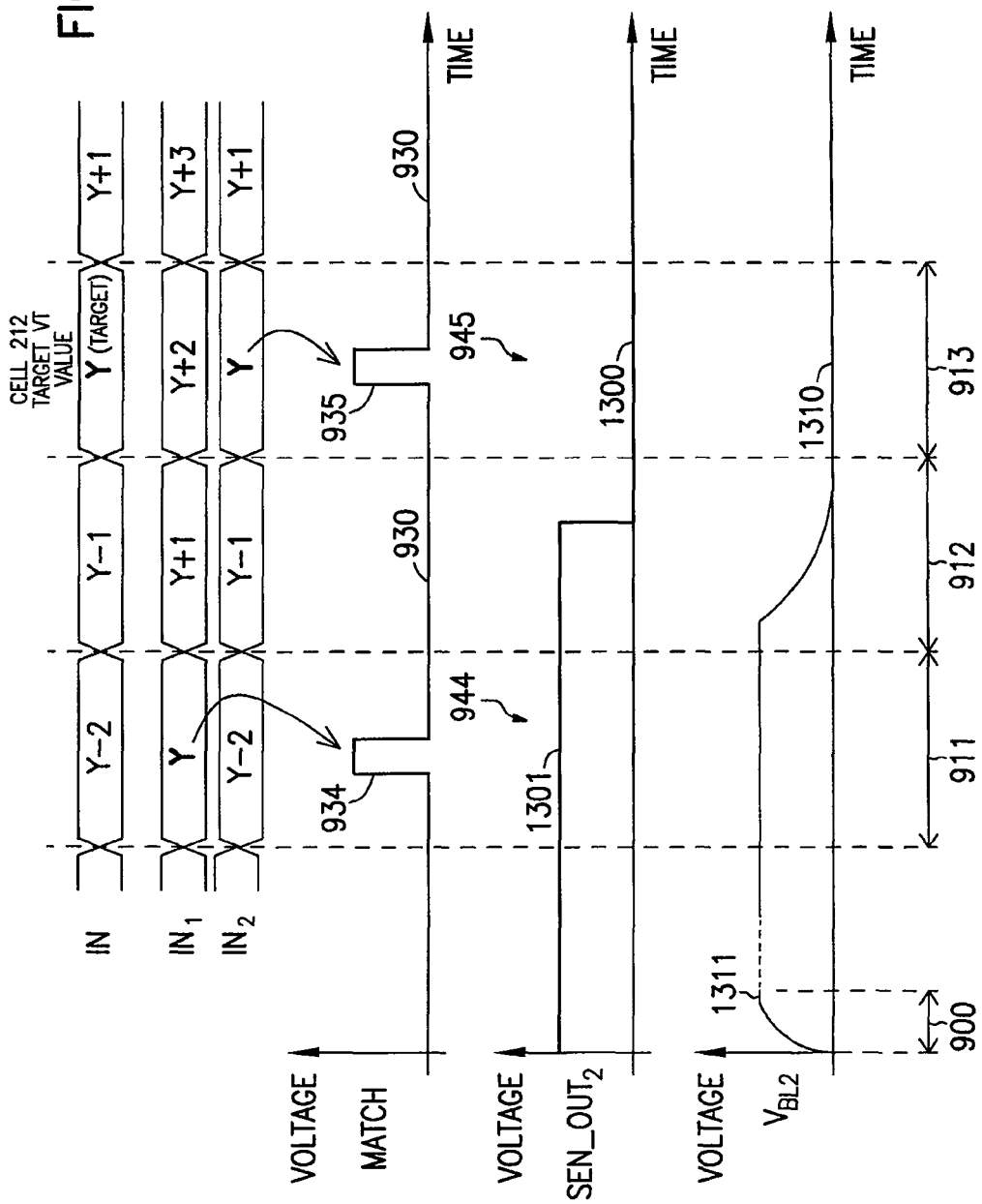
FIG. 13 is a graph showing an example of some signals associated with a second memory cell in the example programming operation described with reference to FIG. 9, according to an embodiment of the invention.

FIG. 13 is a graph showing an example of signal $SEN\_OUT_2$ and signal $V_{BL2}$ associated with memory cell 212 in the example programming operation described with reference to FIG. 9, according to an embodiment of the invention. The example associated with FIG. 13 is similar to that of FIG. 10. As shown in FIG. 13, signal $SEN\_OUT_2$ has signal level value 1301 during time interval 911, indicating that condition $Vt_{212} \geq PPV_i$ is satisfied. FIG. 13 also shows that signal $SEN\_OUT_2$ has signal level value 1300 during time interval 913, indicating that condition $Vt_{212} \geq PV_i$ is unsatisfied.

The signal level values of signal $SEN\_OUT_2$ are based on the signal level values of signal $V_{BL2}$. Sense amplifier 282 (FIG. 8) can operate such that signal level values of signal $SEN\_OUT_2$ follow the signal level values of signal $V_{BL2}$. For example, during time interval 911, the signal level value of signal SEN_OUT$_2$ is high when the signal level value of signal V$_{BL2}$ is high (e.g., value 1311). During time interval 913, the signal level value of signal SEN_OUT$_2$ is low when the signal level value of signal V$_{BL2}$ is low (e.g., value 1310).

FIG. 13 shows an example where Vt$_{212}$>V$_{RAMP}$ during time interval 911 and Vt$_{212}$≤V$_{RAMP}$ during time intervals 912 and 913. In this example, during time interval 900, sense line 272 (FIG. 8) can be charged (e.g., precharged) to a voltage (e.g., Vcc) such that signal V$_{BL2}$ has signal level value 1311. Since Vt$_{212}$>V$_{RAMP}$ during time interval 911 and Vt$_{212}$≤V$_{RAMP}$ during time intervals 912 and 913, sense line 272 maintains its charge during time interval 911 and discharges during time intervals 912 and 913. Thus, as shown in FIG. 13, signal V$_{BL2}$ has signal level value 1311 (e.g., high) during time interval 911 and signal level value 1310 (e.g., low) during time intervals 912 and 913. Therefore, signal SEN_OUT$_2$ also has a corresponding signal level value 1301 (e.g., high) during time interval 911 and a corresponding signal level value 1300 (e.g., low) during time intervals 912 and 913. This indicates that condition Vt$_{212}$≥PPV$_i$ is satisfied during time interval 911 and condition Vt$_{212}$≥PV$_i$ is unsatisfied during time interval 913.

In the example of FIG. 13, memory device 200 repeats the programming of memory cell 212 because condition Vt$_{212}$≥PV$_i$ is unsatisfied. In this example, since condition Vt$_{212}$≥PPV$_i$ is satisfied, indicating that the threshold voltage value of memory cell 212 is near the target threshold voltage value (e.g., PV$_5$), memory device 200 may adjust a voltage value applied to sense line 272 associated with memory cell 212 during the repeat of the programming of memory cell 212. Adjusting such a voltage value may avoid over-programming of memory cell 212. Memory device 200 may adjust (e.g., increase or decrease) the voltage value applied to sense line 272 in ways similar to or identical to those described above for memory cell 210 with reference to FIG. 10.

Figure 14:
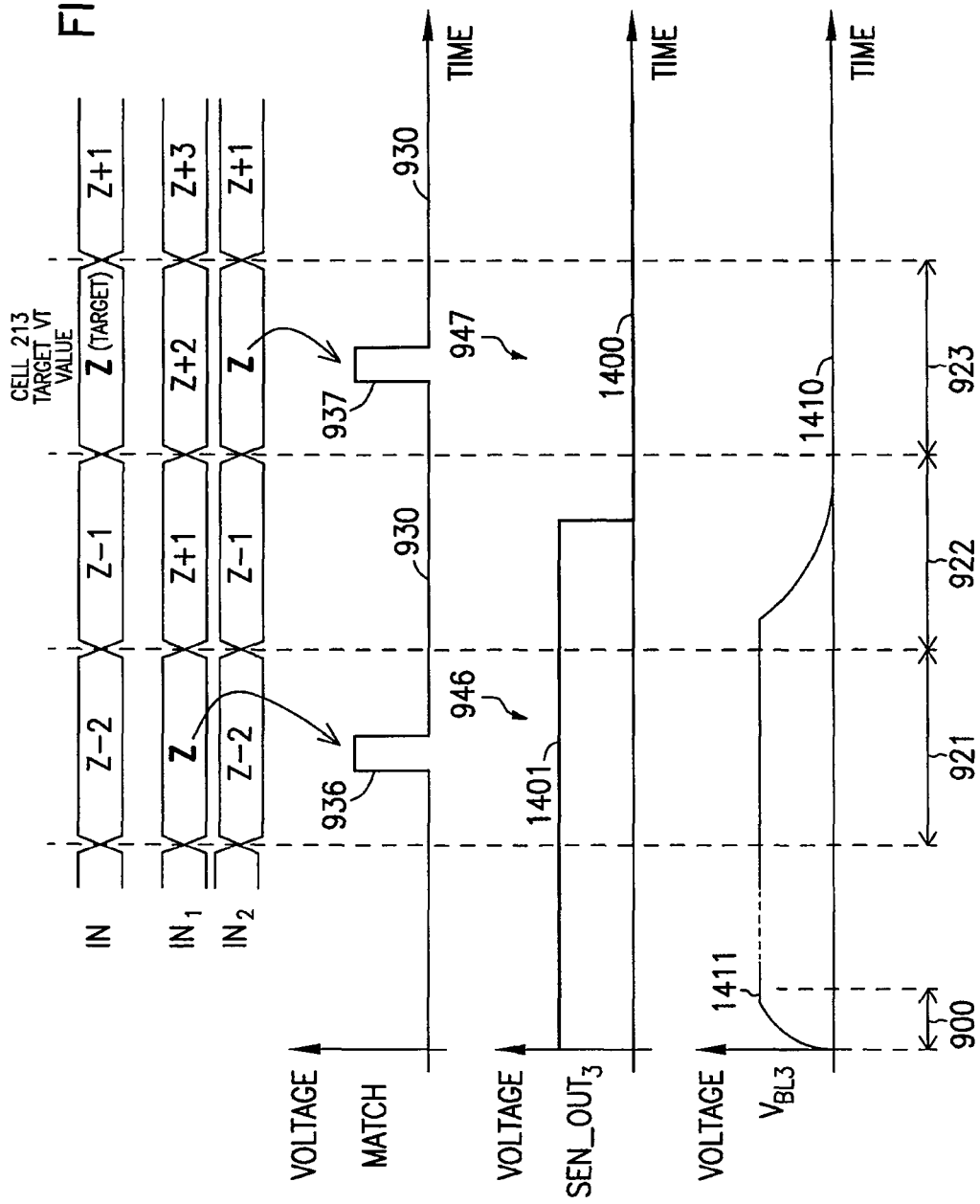
FIG. 14 is a graph showing an example of some signals associated with a third memory cell in the example programming operation described with reference to FIG. 9, according to an embodiment of the invention.

FIG. 14 is a graph showing an example of signal SEN_OUT$_3$ and signal V$_{BL3}$ associated with memory cell 213 in the example programming operation described with reference to FIG. 9, according to an embodiment of the invention. The example associated with FIG. 14 is similar to those of FIG. 10 and FIG. 13. As shown in FIG. 14, signal SEN_OUT$_3$ has signal level value 1401 during time interval 921, indicating that condition Vt$_{213}$≥PPV$_i$ is satisfied. FIG. 14 also shows that signal SEN_OUT$_3$ has signal level value 1400 during time interval 923, indicating that condition Vt$_{213}$≥PV$_i$ is unsatisfied.

The signal level values of signal SEN_OUT$_3$ are based on the signal level values of signal V$_{BL3}$. Sense amplifier 283 (FIG. 8) can operate such that signal level values of signal SEN_OUT$_3$ follow the signal level values of signal V$_{BL3}$. For example, during time interval 921, the signal level value of signal SEN_OUT$_3$ is high when the signal level value of signal V$_{BL3}$ is high (e.g., value 1411). During time interval 923, the signal level value of signal SEN_OUT$_3$ is low when the signal level value of signal V$_{BL3}$ is low (e.g., value 1410).

FIG. 14 shows an example where Vt$_{213}$>V$_{RAMP}$ during time interval 921 and Vt$_{213}$≤V$_{RAMP}$ during time intervals 922 and 923. In this example, during time interval 900, sense line 273 (FIG. 8) can be charged (e.g., precharged) to a voltage (e.g., Vcc) such that signal V$_{BL3}$ has signal level value 1411. Since Vt$_{213}$>V$_{RAMP}$ during time interval 921 and Vt$_{213}$≤V$_{RAMP}$ during time intervals 922 and 923, sense line 273 maintains its charge during time interval 921 and discharges during time intervals 922 and 923. Thus, as shown in FIG. 14, signal V$_{BL3}$ has signal level value 1411 (e.g., high) during time interval 921 and signal level value 1410 (e.g., low) during time intervals 922 and 923. Therefore, signal SEN_OUT$_3$ also has a corresponding signal level value 1401 (e.g., high) during time interval 921 and a corresponding signal level value 1400 (e.g., low) during time intervals 922 and 923. This indicates that condition Vt$_{213}$≥PPV$_i$ is satisfied during time interval 921 and condition Vt$_{213}$≥PV$_i$ is unsatisfied during time interval 923.

In the example of FIG. 14, memory device 200 repeats the programming of memory cell 213 because condition Vt$_{213}$≥PV$_i$ is unsatisfied. In this example, since condition Vt$_{213}$≥PPV$_i$ is satisfied, indicating that the threshold voltage value of memory cell 213 is near the target threshold voltage value (e.g., PV$_7$), memory device 200 may adjust a voltage value applied to sense line 273 associated with memory cell 213 during the repeat of the programming of memory cell 213. Adjusting such a voltage value may avoid over-programming of memory cell 213. Memory device 200 may adjust (e.g., increase or decrease) the voltage value applied to sense line 273 in ways similar to or identical to those described above for memory cell 210 with reference to FIG. 10.

Figure 15:
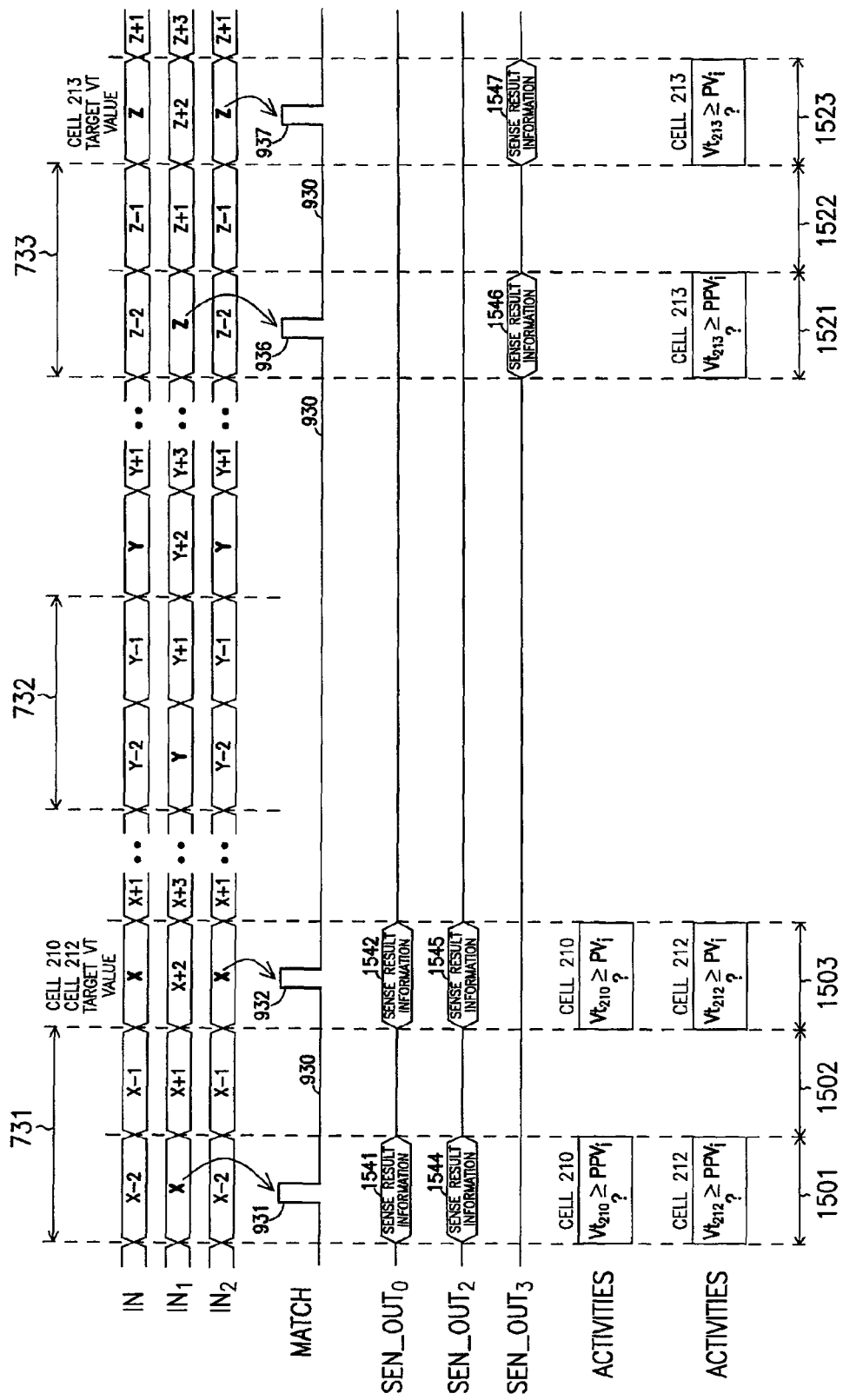
FIG. 15 is a graph showing activities of the memory device of FIG. 2 including determining some conditions during selected time intervals in another example programming of selected memory cells of FIG. 8, according to an embodiment of the invention.

FIG. 15 is a graph showing activities of memory device 200 including determining conditions Vt≥PPV$_i$ and Vt≥PV$_i$ during some time intervals in another example programming of memory cells 210, 212, and 213 of FIG. 7, according to an embodiment of the invention. FIG. 15 is different from FIG. 9 in that, in FIG. 15, both memory cells 210 and 212 are programmed to have the same target threshold voltage value corresponding to values X. Thus, as shown in FIG. 15, when match indication 931 occurs during time interval 1501 (IN1=X), memory device 200 determines whether Vt$_{210}$≥PPV$_i$ and Vt$_{212}$≥PPV$_i$ for memory cells 210 and 212, respectively. Also as shown in FIG. 15, when match indication 932 occurs during time interval 1503 (IN1=X), memory device 200 determines whether Vt$_{210}$≥PV$_i$ and Vt$_{212}$≥PV$_i$ for memory cells 210 and 212, respectively, the same value X of information IN2.

Memory device 200 determines whether Vt$_{213}$≥PPV$_i$ and Vt$_{213}$≥PV$_i$ for memory cell 213 during time intervals 1521 and 1523, respectively, when match indications 936 and 937 occur. Memory device 200 may ignore sense information results when unmatch indications 930 occur at time intervals 1502 and 1522.

Sense result information 1541, 1542, 1544, 1545, 1546, and 1547 can be stored for further activities performed by memory device 200, such as finishing the programming or adjusting a programming rate and repeat programming of some or all of selected memory cells, as described in detail above with reference to FIG. 2 to FIG. 14.

Figure 16:
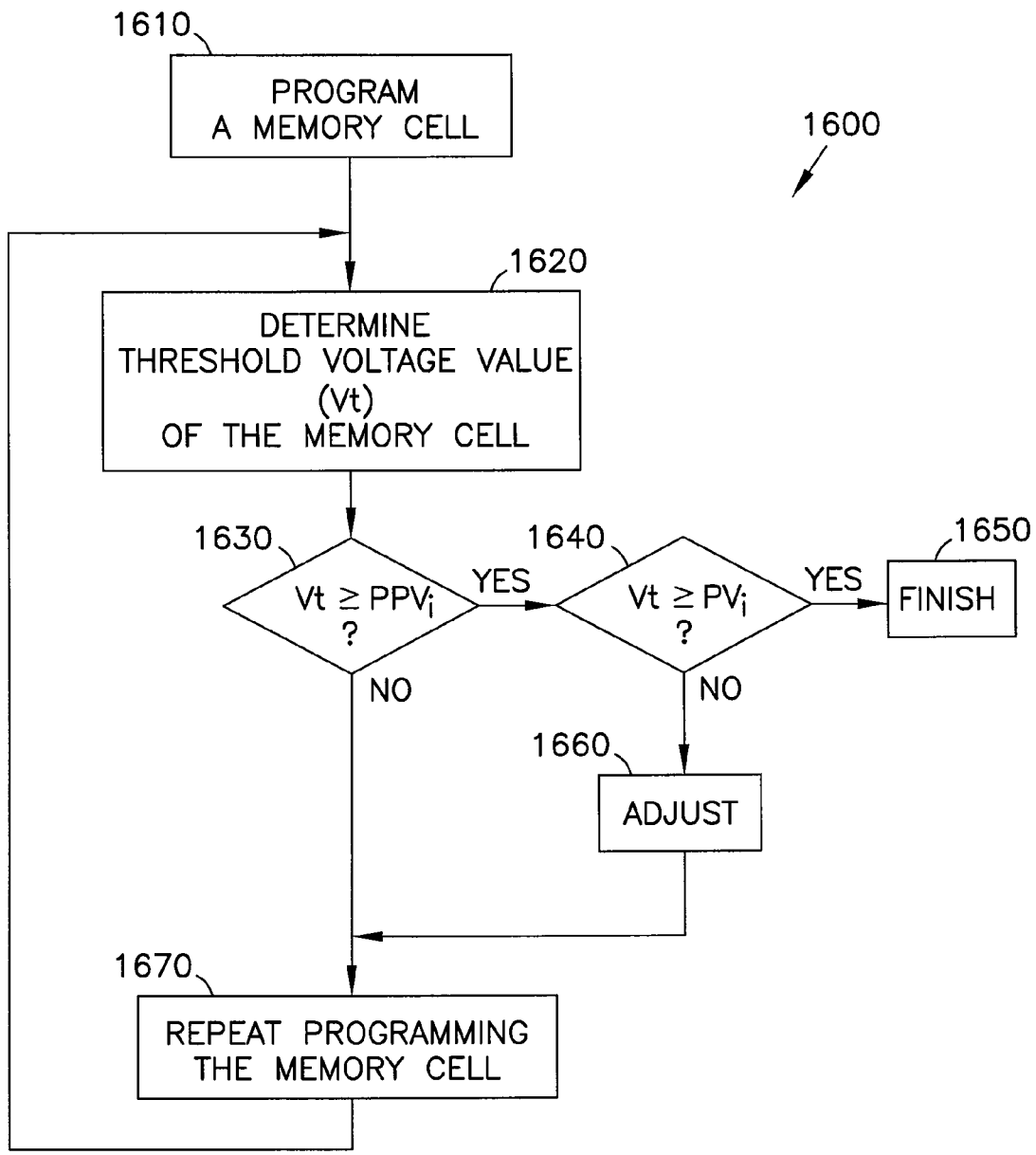
FIG. 16 shows a flow diagram for a method of a programming operation in a memory device, according to an embodiment of the invention.

FIG. 16 shows a flow diagram for a method 1600 of a programming operation in a memory device, according to an embodiment of the invention. Method 1600 can be used to program memory cells of a memory device (e.g., memory device 100 or 200) described above with reference to FIG. 1 through FIG. 15. Thus, method 1600 may include activities and programming operations described above with reference to FIG. 2 through FIG. 15.

As shown in FIG. 16, activity 1610 can include programming a memory cell. Activity 1620 can include determining the threshold voltage value of the memory cell. Determining the threshold voltage value can include determining whether Vt≥PPV$_i$ and Vt≥PV$_i$ for the memory cell. Method 1600 may determining whether Vt≥PPV$_i$ and Vt≥PV$_i$ based on different values of digital information (e.g., information IN) that is used to generate a signal (e.g., V$_{RAMP}$) applied to an access line of the memory cell during the determining of conditions Vt≥PPV$_i$ and Vt≥PV$_i$.

Method 1600 may include activity 1630 to determine whether Vt≥PPV$_i$ and activity 1640 to determine whether $Vt \geq PV_i$. If both of these conditions are satisfied, method 1600 may finish programming the memory cell at activity 1650. If condition $Vt \geq PPV_i$ is satisfied in activity 1630 and condition $Vt \geq PV_i$ is unsatisfied (e.g., $PPV_i \leq Vt \leq PV_i$) in activity 1640, method 1600 may perform activity 1660 to adjust a programming rate. For example, method 1600 may adjust a voltage applied to a sense line associated with the memory cell when method 1600 repeats programming the memory cell at activity 1670. In activity 1630, if condition $Vt \geq PPV_i$ is unsatisfied, method 1600 may also perform activity 1670 to repeat programming of the memory cell at activity 1670, without performing activity 1660. Method 1600 may repeat one or more of activities 1620, 1630, 1640, 1650, 1660, and 1670 until condition $Vt \geq PV_i$ is satisfied.

Other memory cells of the memory device used in method 1600 can be programmed in similar or identical ways, as described here with reference to FIG. 16. Method 1600 can include additional activities and programming operations described above with reference to FIG. 2 through FIG. 15.

The illustrations of apparatus (e.g., memory devices 100 and 200) are intended to provide a general understanding of the structure of various embodiments and are not intended to provide a complete description of all the elements and features of apparatus and systems that might make use of the structures described herein.

Any of the components described above can be implemented in a number of ways, including simulation via software. Thus, apparatus (e.g., a portion of memory device 100 or the entire memory device 100, and a portion of memory device 200 or the entire memory device 200) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100 and 200) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, hand-held computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 16 include memory devices and methods of programming memory cells of the memory device. One such method can include applying a signal to a line associated with a memory cell, the signal being generated based on digital information. The method can also include determining whether a threshold voltage value of the memory cell reaches a first voltage value and a second value based on the values of the digital information and while the signal is applied to the line. Other embodiments including additional memory devices and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
applying a signal to a line associated with a memory cell, the signal being generated based on digital information;
determining whether the memory cell is near a target state when the digital information has a first value and while the signal is applied to the line; and
determining whether the memory cell has reached the target state when the digital information has a second value and while the signal is applied to the line, wherein the digital information includes a plurality of values generated in sequential order, the first value of the digital information corresponds to a first value among the plurality of values, the second value of the digital information corresponds to a second value among the plurality of values, and wherein a difference between the second value and the first value is two.

2. The method of claim 1, wherein determining whether the memory cell is near a target state comprises determining whether a threshold voltage value of the memory cell has reached a first voltage value, and wherein determining whether the memory cell has reached the target state comprises determining whether the threshold voltage value of the memory cell has reached a second voltage value, wherein the second voltage value is greater than the first voltage value.

3. The method of claim 1, further comprising adjusting a programming rate of the memory cell if the memory cell is near the target state.

4. The method of claim 1, further comprising finishing programming of the memory cell if the memory cell has reached the target state.

5. The method of claim 1, further comprising increasing the programming rate of the memory cell if the memory cell is not near the target state and has not reached the target state.

6. The method of claim 1, wherein the second value of the digital information corresponds to a target threshold voltage value of the memory cell.

7. The method of claim 1, wherein the signal includes a value generated based on the first value of the digital information, and the value of the signal is less than the first voltage value.

8. The method of claim 7, wherein the signal includes an additional value generated based on the second value of the digital information, wherein the additional value is less than the second voltage value.

9. The method of claim 2, further comprising:
changing a threshold voltage value of the memory cell before applying the signal to the line.

10. A method comprising:
applying a signal during a first time interval and a second time interval to a first line associated with a memory cell, the signal having a first value generated based on a first value of digital information during the first time interval, and the signal having a second value generated based on a second value of the digital information during the second time interval;

sensing a signal on a second line associated with the memory cell during the first time interval to provide first sense result information indicating a relationship between a state of the memory cell and the first value of the signal; and sensing the signal on the second line during the second time interval to provide second sense result information indicating a relationship between the state of the memory cell and the second value of the signal, wherein the digital information is different from the state of the memory cell.

11. The method of claim 10, wherein the state of the memory cell comprises a threshold voltage value of the memory cell.

12. The method of claim 10, further comprising:
changing the state of the memory cell if the second sense result indicates that the state of the memory cell is less than the second value.

13. The method of claim 11, further comprising:
applying an additional signal to the first line during a programming operation to change the threshold voltage value of the memory cell; and
applying a voltage greater than zero volts to the second line during a programming of the memory cell if the first sense result information indicates that the threshold voltage value of the memory cell before the additional signal applying to the first line is greater than the first value.

14. A method comprising:
applying a signal during a first time interval and a second time interval to a first line associated with a memory cell, the signal having a first value corresponding to a first value of digital information during the first time interval, and the signal having a second value corresponding to a second value of the digital information during the second time interval;
sensing a signal on a second line associated with the memory cell during the first time interval to provide first sense result information indicating a relationship between a state of the memory cell and the first value;
sensing the signal on the second line during the second time interval to provide second sense result information indicating a relationship between the state of the memory cell and the second value;
storing the first sense result information; and
storing the second sense result information.

15. The method of claim 10, wherein the second value is greater than the first value, and the second value includes a target threshold voltage value of the memory cell.

16. An apparatus comprising:
memory cells; and
a module to:
generate a first sequence of values and a second sequence of values;
determine whether a threshold voltage value of a selected memory cell among the memory cells has reached a first value when a selected value among the values of the first sequence matches a value corresponding to a target threshold voltage value of the selected memory cell; and
determine whether the threshold voltage value of the selected memory cell has reached a second value when a selected value among the values of the second sequence matches the value corresponding to the target threshold voltage value of the selected memory cell.

17. The apparatus of claim 16, wherein the module is configured to apply a first voltage to a sense line associated with the selected memory cell during a programming of the selected memory cell if the threshold voltage value of the selected memory cell is less than the first value, and the module is configured to apply a second voltage to the sense line during the programming of the selected memory cell if the threshold voltage value of the selected memory cell is greater than the first value and less than the second value.

18. The apparatus of claim 17, wherein the module is configured to apply a third voltage to the sense line if the threshold voltage value of the selected memory cell has reached the second value.

19. The apparatus of claim 16, wherein the second value includes the target threshold voltage value.

20. The apparatus of claim 16, wherein the module is further configured to:
determine whether a threshold voltage value of an additional selected memory cell of the memory cells has reached a third value when the selected value among the values of the first sequence matches a value corresponding to a target threshold voltage value of the additional selected memory cell; and
determine whether the threshold voltage value of the additional selected memory cell has reached a fourth value when the selected value among the values of the second sequence matches the value corresponding to the target threshold voltage value of the additional selected memory cell.

21. The apparatus of claim 20, wherein the third value is equal to the first value and the fourth value is equal to the second value.

* * * * *